(12) United States Patent
Stupp et al.

(10) Patent No.: US 8,366,974 B2
(45) Date of Patent: Feb. 5, 2013

(54) NANOSCALE LAMELLAR PHOTOCONDUCTOR HYBRIDS AND METHODS OF MAKING SAME

(75) Inventors: Samuel I. Stupp, Chicago, IL (US); Josh Goldberger, Chicago, IL (US); Marina Sofos, Fort Collins, CO (US)

(73) Assignee: Northwestern University, Evanston, IL (US)

( * ) Notice: Subject to any disclaimer, the term of this patent is extended or adjusted under 35 U.S.C. 154(b) by 386 days.

(21) Appl. No.: 12/631,633

(22) Filed: Dec. 4, 2009

(65) Prior Publication Data

US 2010/0143679 A1 Jun. 10, 2010

Related U.S. Application Data

(60) Provisional application No. 61/119,833, filed on Dec. 4, 2008.

(51) Int. Cl.
*H01B 1/08* (2006.01)

(52) U.S. Cl. ............. 252/519.5; 428/213; 205/339; 205/508; 423/622; 977/888; 427/74; 252/519.3

(58) Field of Classification Search ............... 252/519.5, 252/519.3; 428/213; 205/339, 508; 423/622; 977/888; 427/74
See application file for complete search history.

(56) References Cited

U.S. PATENT DOCUMENTS

| | | | |
|---|---|---|---|
| 7,318,986 B2* | 1/2008 | Wu et al. | 430/59.6 |
| 2004/0155517 A1* | 8/2004 | Stupp et al. | 301/17 |
| 2006/0110437 A1* | 5/2006 | Stupp et al. | 424/450 |
| 2006/0149036 A1* | 7/2006 | Stupp et al. | 530/350 |
| 2007/0134930 A1* | 6/2007 | Hastwell et al. | 438/758 |
| 2007/0213410 A1* | 9/2007 | Hastwell et al. | 516/20 |

OTHER PUBLICATIONS

Reese, C. et al., Organic single-crystal field-effect transistors. Mater. Today, 10, 20-27 (2007).
Mitzi, D. B. et al., Organic—inorganic electronics, IBM J. Res. Dev. 45, 29-45 (2001).
Petritz, R. L., Theory of photoconductivity in semiconductor films, Phys. Rev., 104, 1508-1516 (1956).
Konstantatos, G. et al., Ultrasensitive solution-cast quantum dot photodetectors, Nature, 442, 180-183 (2006).
Konstantatos, G. et al., Sensitive solution-processed visible-wavelength photodetectors, Nature Photon., 1, 531-534 (2007).
Mann, S. et al., Synthesis of inorganic materials with complex form, Nature, 382, 313-318 (1996).
Yang, P. D. et al., Hierarchically ordered oxides, Science, 282, 2244-2246 (1998).
Stupp, S. I. et al., Molecular manipulation of microstructures: Biomaterials, ceramics, and semiconductors, Science, 277, 1242-1248 (1997).
Braun, P. V. et al., Semiconducting superlattices templated by molecular assemblies, Nature, 380, 325-328 (1996).
Huang, X. Y. et al., From single to multiple atomic layers: A unique approach to the systematic tuning of structures and properties of inorganic—organic hybrid nanostructured semiconductors, J. Am. Chem. Soc., 129, 3157-3162 (2007).
Osenar, P. et al., Lamellar semiconductor—organic nanostructures from self-assembled templates, Adv. Mater., 8, 1022-1025 (1996).
Coakley, K. M. et al. Infiltrating semiconducting polymers into self-assembled mesoporous titania films for photovoltaic applications, Adv. Funct. Mater., 13, 301-306 (2003).
Nguyen, T. Q. et al. Control of energy transfer in oriented conjugated polymer-mesoporous silica composites, Science, 288, 652-656 (2000).
Messmore, B. W. et al., Synthesis, self-assembly, and characterization of supramolecular polymers from electroactive dendron rodcoil molecules, J. Am. Chem. Soc., 126, 14452-14458 (2004).
Beek, W. J. E. et al., Hybrid solar cells from regioregular polythiophene and ZnO nanoparticles, Adv. Funct. Mater., 16, 1112-1116 (2006).
Schenning, A. P. H. J. et al., Supramolecular electronics; nanowires from self-assembled π-conjugated systems, Chem. Commun., 3245-3258 (2005).
Hulvat, J. F. et al., Self-assembly and luminescence of oligo(p-phenylene vinylene) amphiphiles, J. Am. Chem. Soc., 127, 366-372 (2005).
Sofos, M. et al. Nanoscale structure of self-assembling hybrid materials of inorganic and electronically active organic phases, J. Phys. Chem. C, 112, 2881-2887 (2008).
Tajima, K. et al., Nanostructured oligo(p-phenylene vinylene)/silicate hybrid films: One-step fabrication and energy transfer studies, J. Am. Chem. Soc., 128, 5488-5495 (2006).
Jing, H. Y. et al. Electrochemical self-assembly of highly oriented ZnO-surfactant hybrid multilayers, J. Phys. Chem. B, 109, 2881-2884 (2005).
Usui, H. et al., Ultraviolet emission from layered nanocomposites of Zn(OH)2 and sodium dodecyl sulphate prepared by laser ablation in liquid, Appl. Phys. Lett., 87, 063105 (2005).
Choi, K. S. et al., Electrochemical synthesis of nanostructured ZnO films utilising self-assembly of surfactant molecules at solid—liquid interfaces, J. Am. Chem. Soc., 124, 12402-12403 (2002).

(Continued)

*Primary Examiner* — Douglas McGinty
(74) *Attorney, Agent, or Firm* — Morris, Manning & Martin, LLP; Tim Tingkang Xia, Esq.

(57) ABSTRACT

An article of manufacture and methods of making same. In one embodiment, the article of manufacture has a plurality of zinc oxide layers substantially in parallel, wherein each zinc oxide layer has a thickness $d_1$, and a plurality of organic molecule layers substantially in parallel, wherein each organic molecule layer has a thickness $d_2$ and a plurality of molecules with a functional group that is bindable to zinc ions, wherein for every pair of neighboring zinc oxide layers, one of the plurality of organic molecule layers is positioned in between the pair of neighboring zinc oxide layers to allow the functional groups of the plurality of organic molecules to bind to zinc ions in the neighboring zinc oxide layers to form a lamellar hybrid structure with a geometric periodicity $d_1+d_2$, and wherein $d_1$ and $d_2$ satisfy the relationship of $d_1 \leq d_2 \leq 3d_1$.

23 Claims, 35 Drawing Sheets

OTHER PUBLICATIONS

Ogata, S. et al., New preparation method for organic-inorganic layered compounds by organo derivatization reaction of Zn(OH)2 with carboxylic acids, J. Mater. Chem., 10, 321-327 (2000).

Soci, C. et al. ZnO nanowire UV photodetectors with high internal gain, Nano Lett., 7, 1003-1009 (2007).

Law, M. et al. Nanowire dye-sensitized solar cells, Nature Mater., 4, 455-459 (2005).

Mottaghi, M. et al. Low-operating-voltage organic transistors made of bifunctional self-assembled monolayers, Adv. Funct. Mater., 17, 597-604 (2007).

Quist, P. A. C. et al. Photogeneration and decay of charge carriers in hybrid bulk heterojunctions of ZnO nanoparticles and conjugated polymers, J. Phys. Chem. B, 110, 10315-10321 (2006).

Olson, D. C. et al. Hybrid photovoltaic devices of polymer and ZnO nanofiber composites, Thin Solid Films, 496, 26-29 (2006).

Brinker, C. J. et al., Evaporation-induced self-assembly: Nanostructures made easy, Adv. Mater., 11, 579-585 (1999).

Boeckler, C. et al., Role of the critical micelle concentration in the electrochemical deposition of nanostructured ZnO films under utilization of amphiphilic molecules, Langmuir, 22, 9427-9430 (2006).

Yoshida, T. et al. Self-assembly of zinc oxide thin films modified with tetrasulfonated metallophthalocyanines by one-step electrodeposition, Chem. Mater., 11, 2657-2667 (1999).

Blom, F. R. et al., R. F. Planar magnetron sputtered ZnO films II: Electrical properties, Thin Solid Films, 204, 365-376 (1991).

Gijzeman, O. L. J. et al., Triplet excimer emission from pyrene single crystals, Chem. Phys. Lett., 5, 269-272 (1970).

Broich, B. et al., Charge transfer between zinc oxide crystals and dye layers, Surf. Sci., 92, 247-264 (1980).

Munoz, E. et al. Photoconductor gain mechanisms in GaN ultraviolet detectors, Appl. Phys. Lett., 71, 870-872 (1997).

Pacholski, C. et al., Self-assembly of ZnO: From nanodots, to nanorods, Angew. Chem. Int. Ed., 41, 1188-1191 (2002).

Daubler, T. K. et al. Photogeneration and transport of charge carriers in hybrid materials of conjugated polymers and dye-sensitized TiO2, J. Appl. Phys., 86, 6915-6923 (1999).

Yamamoto, Y. et al. Photoconductive coaxial nanotubes of molecularly connected electron donor and acceptor layers, Science 314, 1761-1764 (2006).

Dong, L. et al., Fabrication and characterization of integrated uncooled infrared sensor arrays using a-Si thin-film transistors as active elements, J. Microelectromech, 14, 1167-1177 (2005).

Kagan, J. et al., 2,2'-5',2"-terthiophene-5-carboxylic acid and 2,2'-5',2"-terthiophene-5,5"-dicarboxylic acid, J. Org. Chem., 48, 4076-4078 (1983).

Porter, V. J. et al. Photoconduction in annealed and chemically treated CdSe/ZnS inorganic nanocrystal films, J. Phys. Chem. C, 112, 2308-2316 (2008).

Loutfy, R. O. et., Electrochemical evaluation of electron acceptor materials, Can. J. Chem., 62, 1877-1885 (1984).

Oswald, H. & Asper, R. in Preparation and Crystal Growth of Materials with Layered Structures (ed. Lieth, R. M. A.) 71 (D. Reidel Publishing Company, 1977).

Gomez-Romero, P. et al., Multifunctional Hybrid Materials based on conducting organic polymers. Nanocomposite systems with photo-electro-Ionic properties and applications, (Wiley—VCH, 2004).

Müllen, K. & Wegner, G. Electronic Materials: The Oligomer Approach, (Weinham, 1998).

* cited by examiner

|  | Zn-O | | | Zn-Zn | | |
|---|---|---|---|---|---|---|
|  | N | ΔR(Å) | σ²(Å²) | N | ΔR(Å) | σ²(Å²) |
| Sample/150 °C | 4.0 | -0.083 | 0.0027 | 6.7 | 0.007 | 0.0131 |
| ZnO standard | 4.0 | -0.071 | 0.0035 | 12 | 0.015 | 0.0098 |

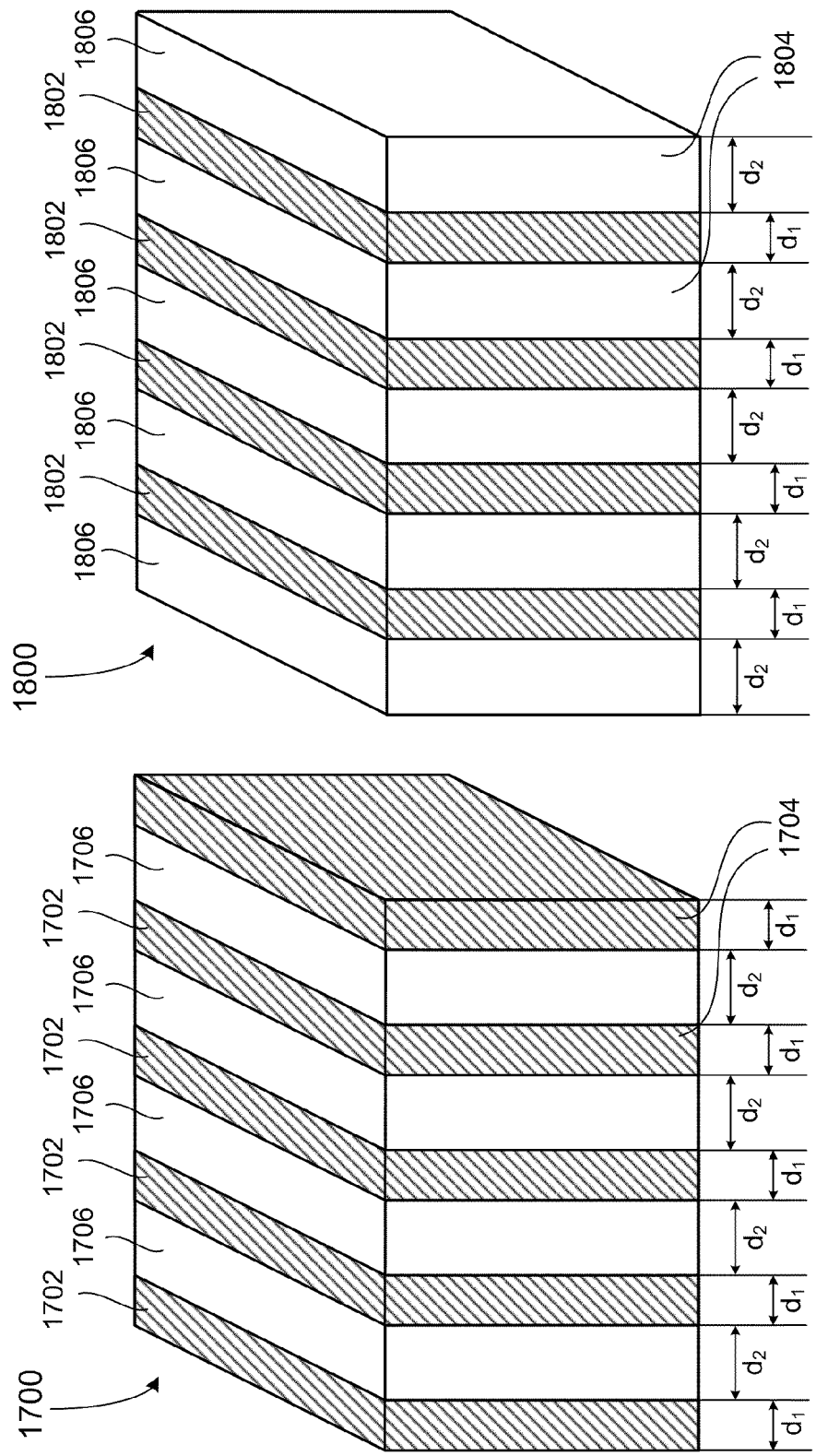

NANOSCALE LAMELLAR PHOTOCONDUCTOR HYBRIDS AND METHODS OF MAKING SAME

CROSS-REFERENCE TO RELATED PATENT APPLICATION

This application claims priority to and the benefit of, pursuant to 35 U.S.C. §119(e), U.S. provisional patent application Ser. No. 61/119,833, filed Dec. 4, 2008, entitled "BI-FUNCTIONAL ORGANIC/ZINC OXIDE NANOSTRUCTURED HYBRID FILMS, METHODS OF MAKING SAME, AND APPLICATIONS OF SAME," by Josh Goldberger, Marina Sofos and Samuel I. Stupp, the contents of which is incorporated herein in its entirety by reference.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "n" represents the nth reference cited in the reference list. For example, [ ]$^8$ represents the 8th reference cited in the reference list, namely, Stupp, S. I. & Braun, P. V. Molecular manipulation of microstructures: Biomaterials, ceramics, and semiconductors. *Science* 277, 1242-1248 (1997).

STATEMENT OF FEDERALLY-SPONSORED RESEARCH

This invention was made with government support under Grant No. DE-FG02-00ER54810 awarded by the Department of Energy and grant number DMR0605427 awarded by the National Science Foundation. The government has certain rights in the invention.

FIELD OF THE INVENTION

The present invention relates generally to the formation of a lamellar hybrid nanostructure that can be used as a photoconductor.

BACKGROUND

The ever-growing use of photodetectors, in a wide range of both everyday and high-end applications, has flourished in the digital age. Excellent photodetection performance is realized with sensors integrated into complementary metal-oxide-semiconductor devices, and fabricated from semiconductors such as expensive, highly engineered crystalline silicon or biologically hazardous Cd-, Pb-, Hg- and As-based compounds. The development of efficient, environmentally benign, wavelength-tunable photoconductor materials can provide new applications in flexible, low-cost, lightweight and disposable photodetectors. Organics are naturally suited to meet these requirements. When used alone, however, organics are often susceptible to device degradation through charge trapping and photo-oxidation.

Achieving highly ordered nanostructured organic/inorganic hybrids in which both components contribute to overall functionality is critical for optimizing optoelectronic device performance[1, 2]. For example, to make highly sensitive polycrystalline photoconductors, it is necessary to maximize the density of long-lifetime trap states that enable photoconductive gain while minimizing transport noise associated with trap states at the interfaces between crystallites[3, 4]. Recent studies have shown that ultrasensitive photodetectors can be made from fused PbS nanoparticles, provided that their trap states do not exist at nanoparticle grain boundaries and disrupt their conductivity[4, 5]. Incorporating organic dyes into the network can offer extra benefits such as tuning the optical photoaction spectra and the lifetime of trap states with molecular structure. On photoexcitation, electrons are injected from the organic into the inorganic, with the remaining hole on the organic serving as a long-lifetime trap state. Optimum sensitivity is expected by controlling the assembly and nanostructure of the two components to maximize the density of organic dye bound to the surface of nanoparticles and to minimally disrupt conduction through the percolating network.

Many successful strategies have been developed that incorporate the interactions of a structure-directing organic to template ordered nanoscale morphologies of a conductive inorganic phase[6, 7, 8, 9, 10, 11]. In these examples, the organic is not electronically active and remains solely to maintain the overall nanostructure. An extension of these strategies is to remove and replace the structure-directing organic with functional organic components after templating[12, 13]. This provides little, if any, control over the order parameter in the functional organic phase because it does not participate in the mineralization process.

Therefore, a heretofore unaddressed need exists in the art to address the aforementioned deficiencies and inadequacies.

SUMMARY OF THE INVENTION

In one aspect, the present invention provides a method for making a nanostructure. In one embodiment, the method includes the steps of a) providing a H2O/dimethylsulphoxide (DMSO) solution of Zn(NO)3.6H2O and surfactant in an undivided cell with a three-electrode configuration for electrochemical synthesis;

b) performing electrochemical synthesis to the solution to allow a nanostructure with $Zn(OH)_2$ films to grow on at least one working electrode at a first temperature T1; and c) converting the nanostructure with $Zn(OH)_2$ films to a nanostructure with ZnO films at a second temperature T2, wherein the first temperature T1 and the second temperature T2 satisfy the relationship of T1<T2, and wherein as formed the nanostructure with ZnO films is characterized with a hybrid structure where between any two neighboring ZnO films, there is one layer of surfactant in contacting with the two neighboring ZnO films.

In yet another aspect, the present invention provides an article of manufacture. In one embodiment, the article of manufacture has a) a plurality of zinc oxide layers substantially in parallel, wherein each zinc oxide layer has a thickness $d_1$; and b) a plurality of organic molecule layers substantially in parallel, wherein each organic molecule layer has a thickness $d_2$ and a plurality of molecules with a functional group that is bindable to zinc ions;

wherein for every pair of neighboring zinc oxide layers, one of the plurality of organic molecule layers is positioned in between the pair of neighboring zinc oxide layers to allow the functional groups of the plurality of organic molecules to bind to zinc ions in the neighboring zinc oxide layers to form a lamellar hybrid structure with a geometric periodicity $d_1+d_2$, and wherein $d_1$ and $d_2$ satisfy the relationship of $d_1 \leq d_2 \leq 3d_1$.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The drawings described below are for illustration purposes only. The drawings are not intended to limit the scope of the present teachings in any way.

FIG. 7 is a table of FEFF results (N-coordination number; $\Delta R$-relative change in bond distance; $\sigma^2$-Debye-Waller factors) obtained from EXAFS data for electrodeposited film with PyBA annealed to 150° C. and ZnO nanoparticle powder standard.

FIG. 17 shows an article of manufacture or nanostructure according to one embodiment of the present invention.

FIG. 18 shows an article of manufacture or nanostructure according to another embodiment of the present invention.

DETAILED DESCRIPTION

Figure 1A:
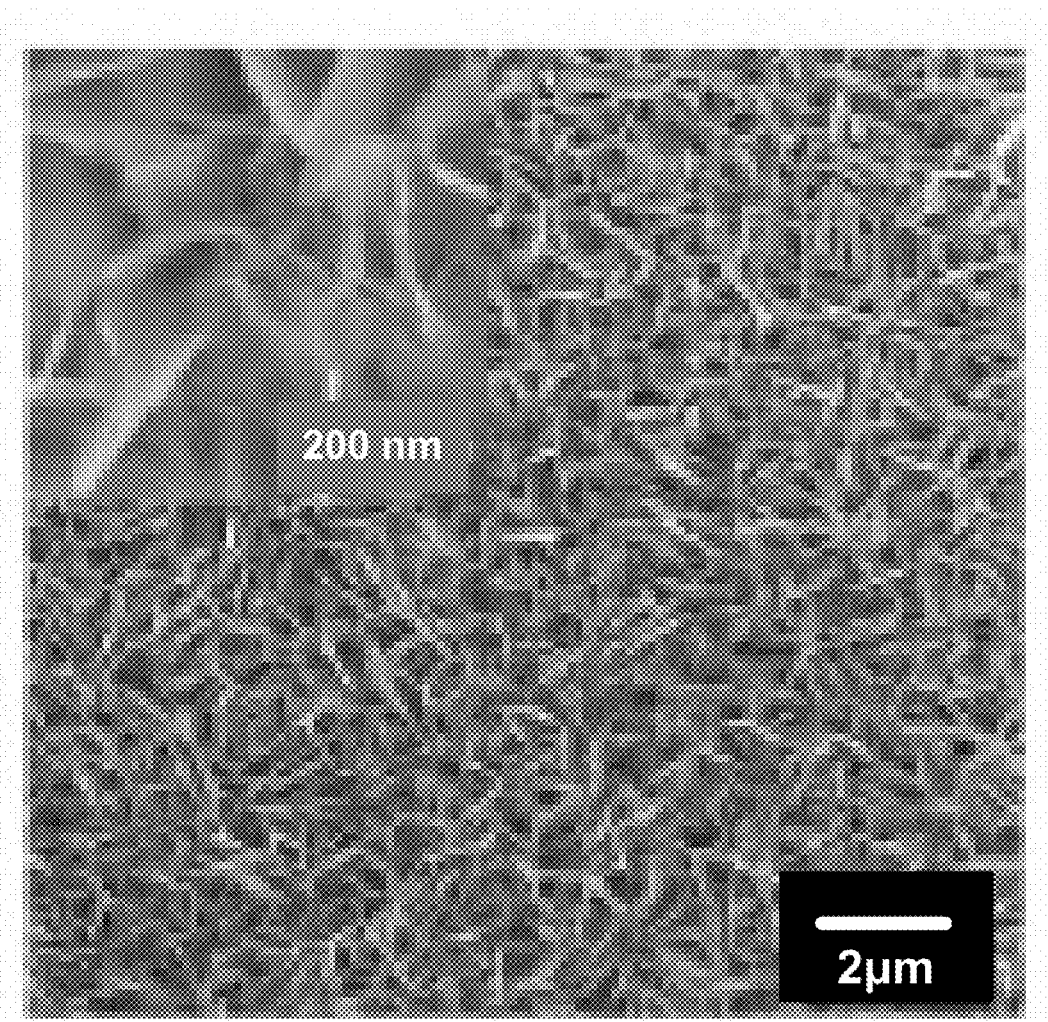
FIG. 1 shows morphology of lamellar hybrid nanostructure according to one embodiment of the present invention: (a) SEM (top-down) image of deposited platelets using PyBA, magnified in the inset; (b) SEM (cross-sectional view) image of deposited platelets using PyBA; (c) TEM image of lamellar sheets within platelets deposited using PyBA, magnified in the inset; and (d) Schematic diagram of lamellar ordering composed of inorganic Zn-rich regions and bilayers of PyBA.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, if any, the term "transmission electron microscopy (TEM)" refers to a microscopy technique whereby a beam of electrons is transmitted through an ultra thin specimen, interacting with the specimen as it passes through it. An image is formed from the electrons transmitted through the specimen, magnified and focused by an objective lens and appears on an imaging screen, a fluorescent screen in most TEMs, plus a monitor, or on a layer of photographic film, or to be detected by a sensor such as a CCD camera.

As used herein, if any, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "scanning tunneling microscope (STM)" is a technique for viewing surfaces at the atomic level. STM probes the density of states of a material using tunneling current. The STM is based on the concept of quantum tunneling. When a conducting tip is brought very near to a metallic or semiconducting surface, a bias between the two can allow electrons to tunnel through the vacuum between them. For low voltages, this tunneling current is a function of the local density of states (LDOS) at the Fermi level, $E_f$, of the sample. Variations in current as the probe passes over the surface are translated into an image.

As used herein, if any, "nanoscopic-scale," "nanoscopic," "nanometer-scale," "nanoscale," the "nano-" prefix, and the like generally refers to elements or articles having widths or diameters of less than about 1 µm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

Overview of the Invention

The present invention provides, among other things, highly ordered nanostructured organic/inorganic hybrids that offer chemical tunability, novel functionalities and enhanced performance over their individual components. While hybrids of complementary p-type organic and n-type inorganic components have attracted interest in optoelectronics, where high-efficiency devices with minimal cost are desired, the present invention demonstrates self-assembly of a lamellar hybrid containing periodic and alternating 1-nm-thick sheets of polycrystalline ZnO separated by 2-3 nm layers of conjugated molecules, directly onto an electrode. Initially the electrode-posited inorganic is $Zn(OH)_2$, but π-π interactions among conjugated molecules stabilize synergistically the periodic nanostructure as it converts to ZnO at 150° C. As photoconductors, normalized detectivities (D*) greater than $2 \times 10^{10}$ Jones, photocurrent gains of 120 at 1.2 V µm$^{-1}$ and dynamic ranges greater than 60 dB are observed on selective excitation of the organic by practicing the present invention. These are among the highest values measured for organic, hybrid and amorphous silicon, making them technologically competitive as low-power, wavelength-tunable, flexible and environmentally benign photoconductors.

In general, self-assembly of organic systems is desirable for enhancing hole conduction or optical properties owing to improved π-stacking[14, 15, 16, 17]. In this context, templating insulating silica frameworks using surfactants containing electronically active conjugated moieties has been recently explored by the inventors[18, 19]. The conjugated segments controlled the assembly and enhanced long-range ordering of hybrids owing to their tendency to π-stack. To synthesize hybrid nanostructures having both electronically active organic and inorganic components, the inventors were inspired by recent studies of electrodeposited binary semiconductors templated by alkylated surfactants. Specifically, the synthesis of lamellar morphologies of ZnO have been claimed, but there is a dispute over the identity of the inorganic phase formed (the semiconductor ZnO versus the insulator $Zn(OH)_2$.[20-23] ZnO is a well-established material for both photoconduction and photovoltaics,[24, 25] and thiophene-based polymers and oligomers are also attractive candidates for optoelectronics. It is also known that efficient hole conduction can occur in single monolayers of thiophene oligomers[26]. From their relative conduction/valence bands and highest occupied molecular orbital/lowest unoccupied molecular orbital energy levels, ZnO and most thiophene derivatives typically form type-II interfaces with rapid and efficient charge separation[27]. For these reasons, ZnO/thiophene hybrids have shown promise in photovoltaics and photoconduction[28, 29]. Electrodeposition is an attractive technique to synthesize hybrids because the temperature range is compatible with organics. But only in the present invention, this technique was coupled with the principles of self-assembly to synthesize lamellar hybrids with strongly interacting amphiphilic molecules containing optoelectronic functionality. These films are grown on the surface of an electrode, enabling their direct integration into functional photoconductor devices.

The present invention provides hybrid nanostructures that are grown on working electrodes through cathodic deposition from a $H_2O$/dimethylsulphoxide (DMSO) solution of $Zn(NO)_3.6H_2O$ and surfactant. The surfactants used are shown in Table 1. All contain a functional group that can bind to zinc ions in the inorganic phase, and their hydrophobic segment is either an alkyl group or a conjugated moiety (pyrene or oligothiophene).

TABLE 1

General Design of Organic Surfactants and Resulting Lamellar Structures. Table of surfactants used with molecular structures, calculated lengths, and resulting dimensions of deposited hybrid nanostructures. Molecular structures of surfactants include binding group, alkyl linker, and conjugated segment, respectively, as known to people skilled in the art.

| surfactant | molecular length | hybrid d-spacing |
|---|---|---|
| SDS | 1.9 nm | 3.2 nm, 2.8 nm |
| decanoic acid | 1.2 nm | 2.8 nm |
| PyBA | 1.3 nm | 3.2 nm |
| PyCA | 0.9 nm | 2.6 nm |
| 3TCA | 1.4 nm | 3.8 nm |

TABLE 1-continued

General Design of Organic Surfactants and Resulting Lamellar Structures. Table of surfactants used with molecular structures, calculated lengths, and resulting dimensions of deposited hybrid nanostructures. Molecular structures of surfactants include binding group, alkyl linker, and conjugated segment, respectively, as known to people skilled in the art.

| surfactant | molecular length | hybrid d-spacing |
|---|---|---|
| 5TmDCA | 2.4 nm | 2.5 nm |

Figure 1B:
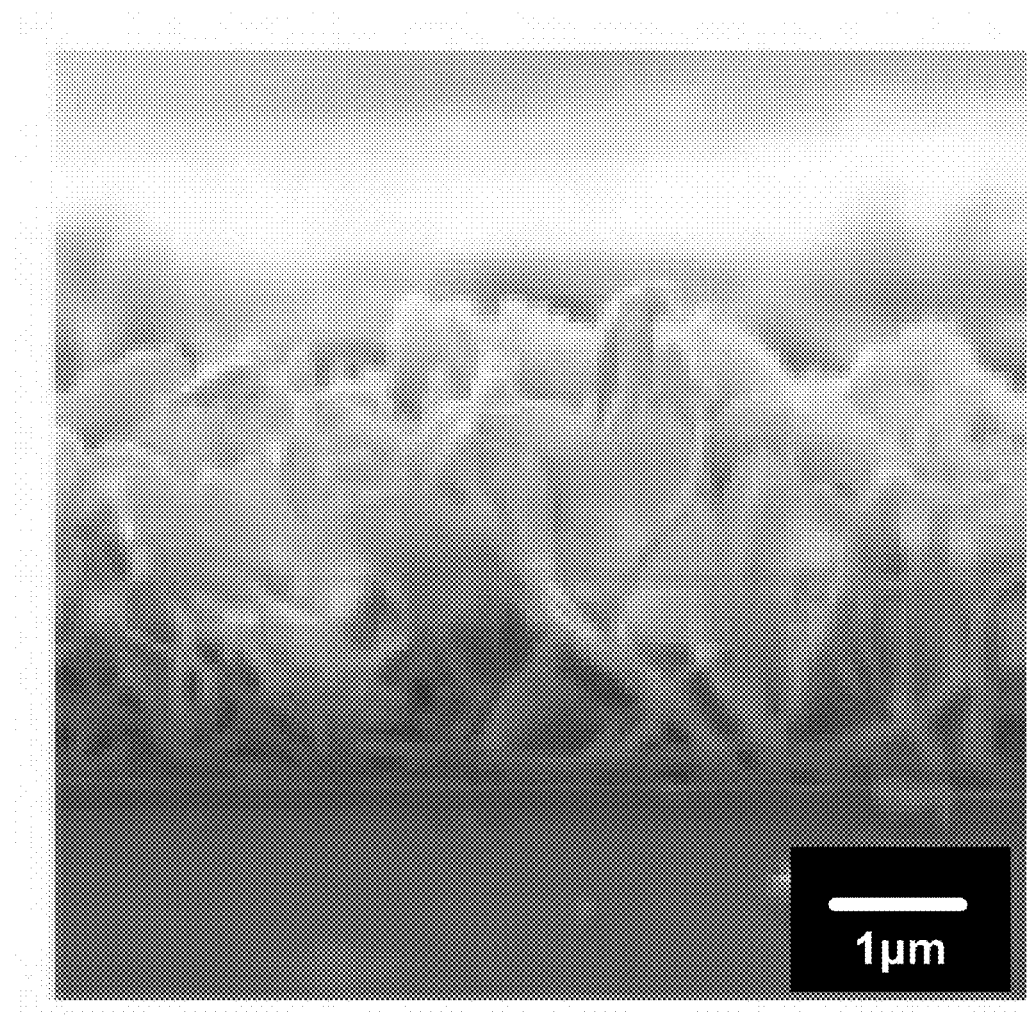
Figure 1C:
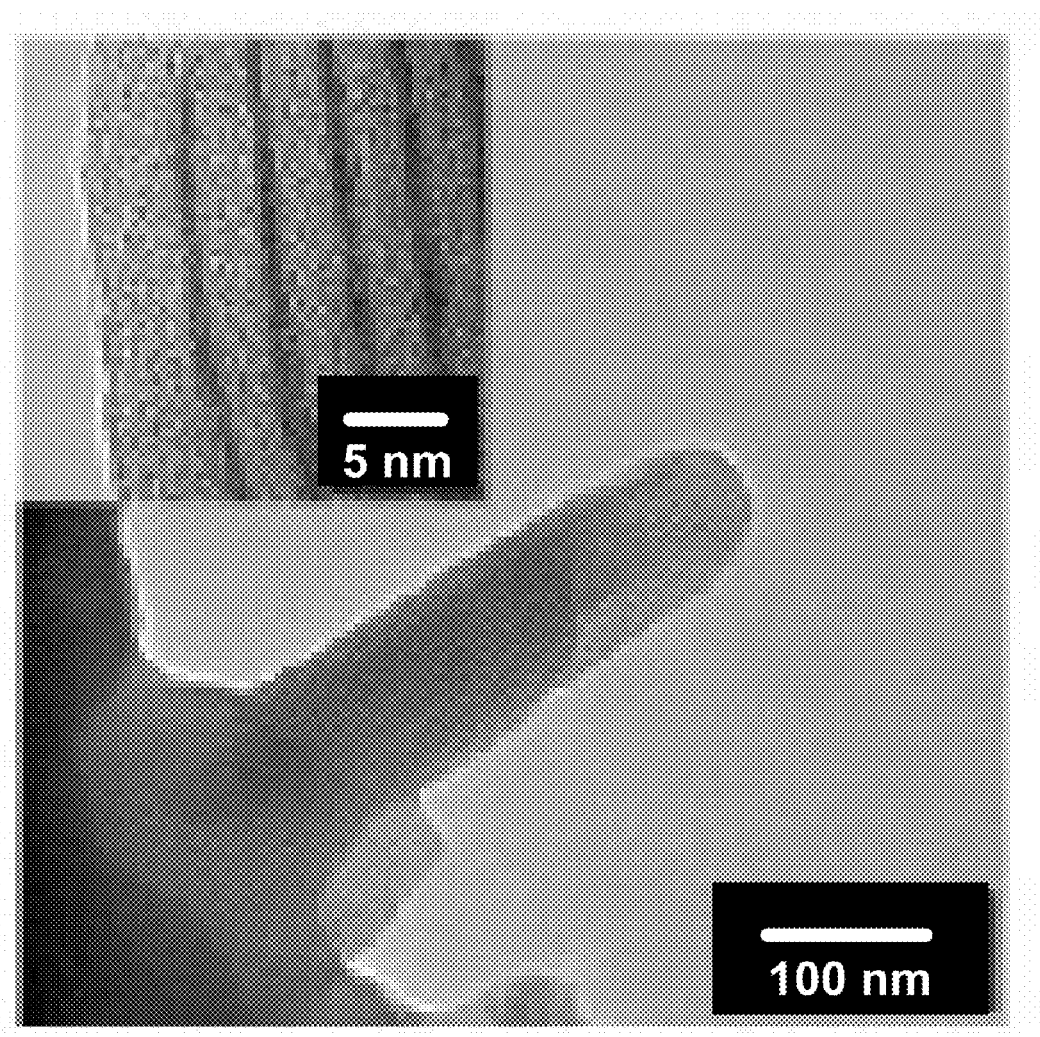
Figure 1D:
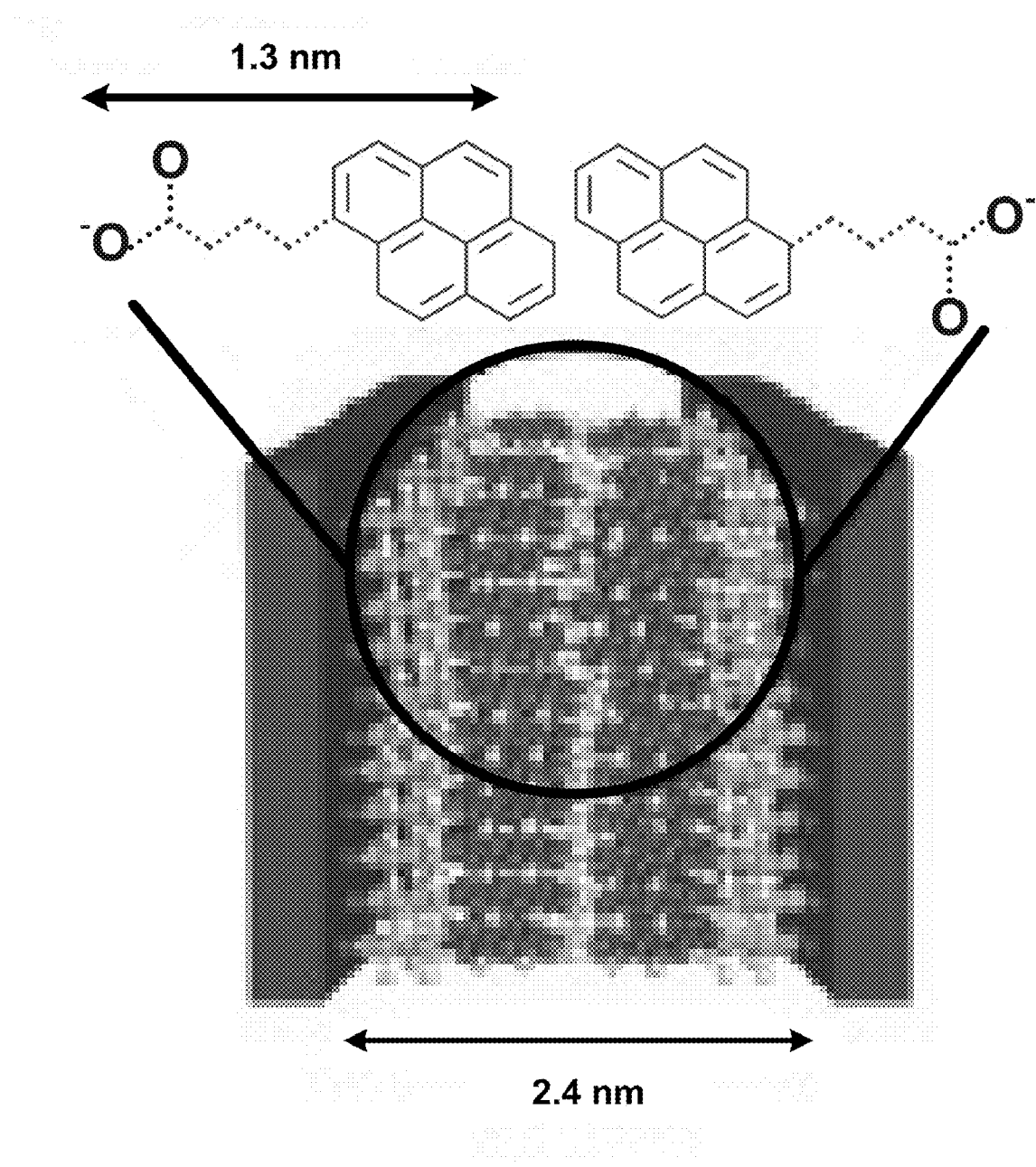
Figure 2A:
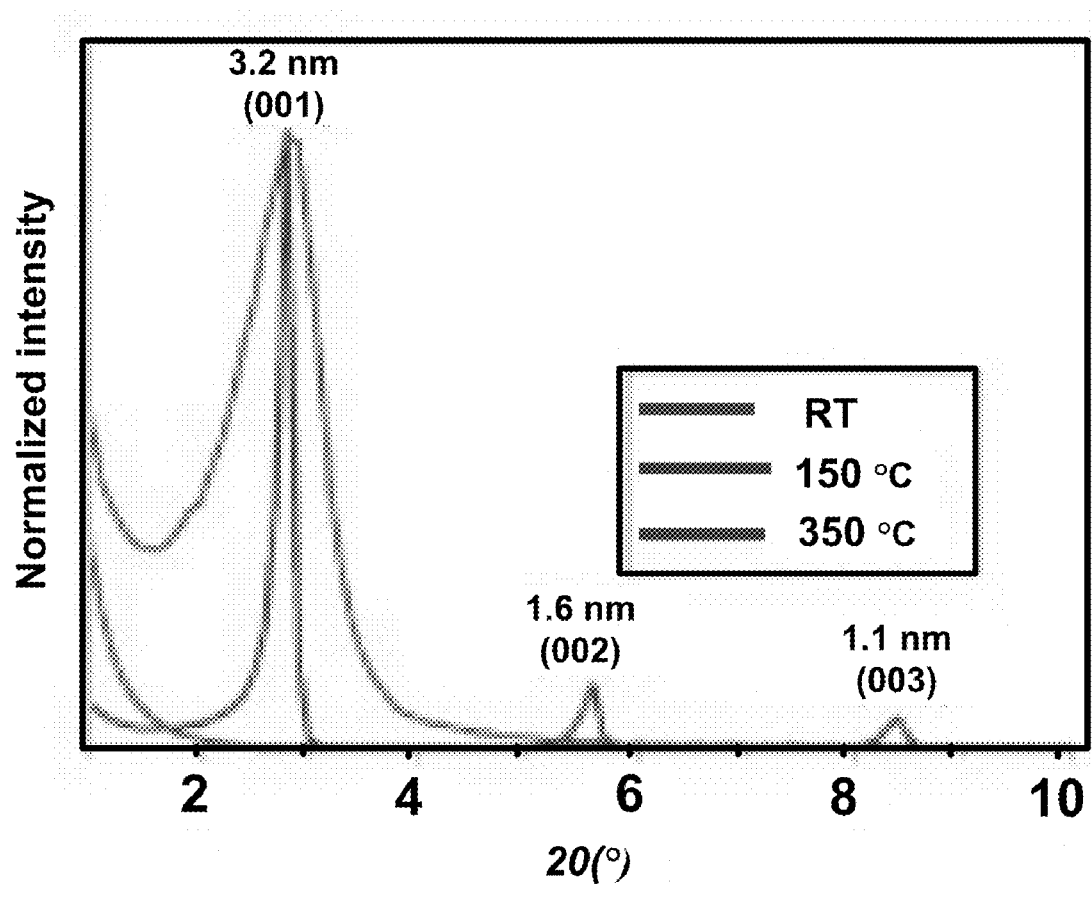
FIG. 2 relates to identity of inorganic phase and effect of annealing: (a) XRD patterns of hybrid films deposited with PyBA as a function of heat treatment (pre-anneal, 150° C. and 350° C.). The $d_{001}$ peak increased in width, corresponding to a decrease in the domain size, d, from 90 to 20 nm based on the Debye-Scherrer equation ($d=0.9\lambda/F \cos\alpha$, F: full-width at half-maximum); (b) XANES spectra of hybrid films deposited with PyBA as a function of heat treatment (pre-anneal, 150° C. and 350° C.) and of $Zn(OH)_2$ and ZnO standards; (c) Local structure of the 150° C.-annealed sample (fast Fourier transform of the extended X-ray absorption fine structure), compared with that of nano-ZnO; (d) High-resolution TEM image and electron diffraction pattern of hybrid film deposited with PyBA before heat treatment ($Zn(OH)_2$). The broad 2.5-2.8 Å lattice spacing oriented normal to the plane, and the sharper 1.7 Å and 2.9 Å spacings parallel to the plane indicate diffraction from a confined two-dimensional lattice. These peak spacings do not correspond with any known $Zn(OH)_2$ polymorph, although the crystal structures of the layered $\rho$ and $\delta$ polymorphs have yet to be to solved; (e) TEM image and electron diffraction pattern of hybrid film deposited with PyBA on 150° C. heat treatment (ZnO); and (f) TEM image and electron diffraction pattern of hybrid film deposited with PyBA on 350° C. heat treatment (ZnO). The electron diffraction patterns after annealing (e,f) are indexed to ZnO.
Figure 5:
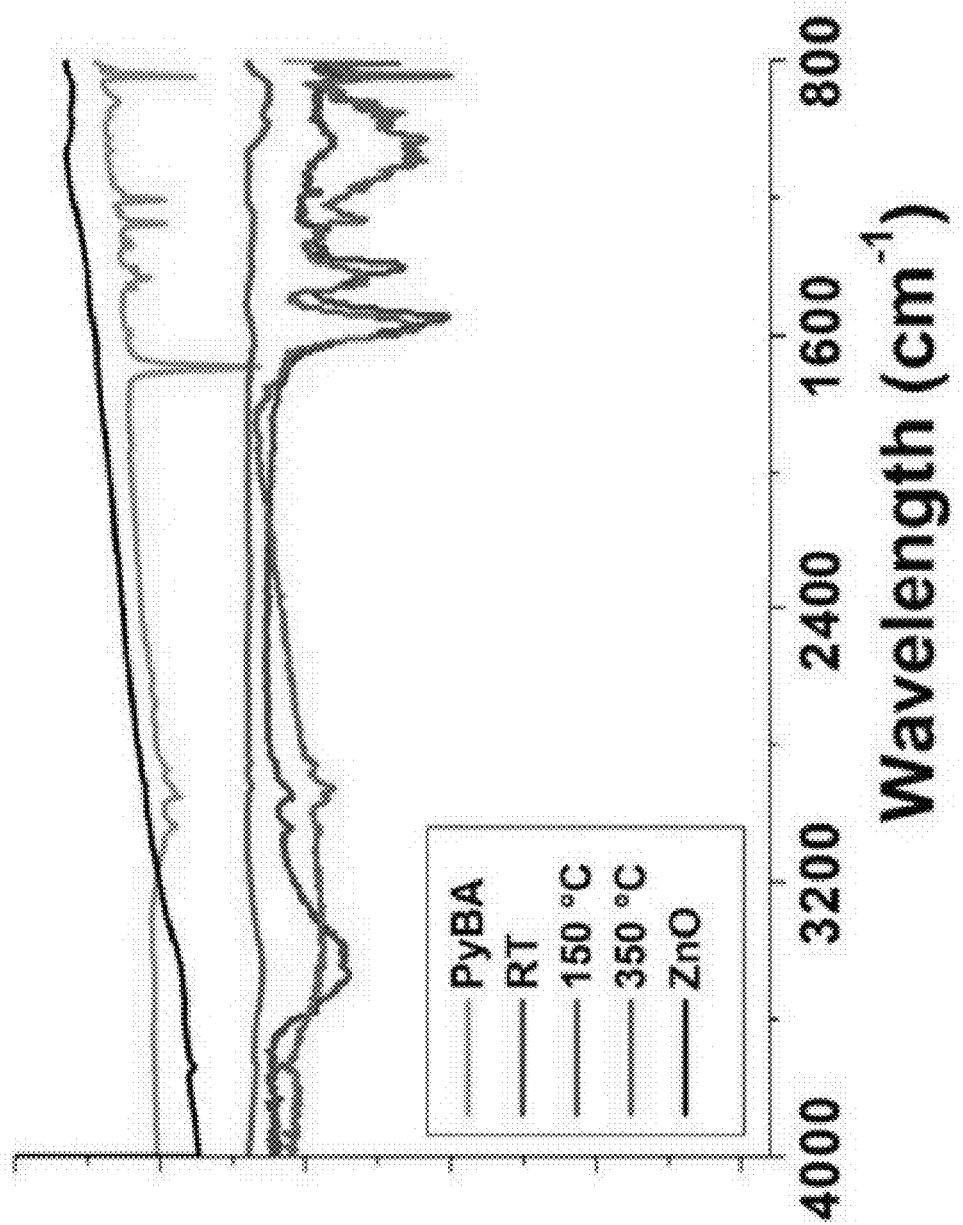
FIG. 5 is a graph showing TGA of hybrid film electrodeposited from 0.05 wt % PyBA in 1:1 (v/v) $H_2O$/DMSO.

FIG. 1(a) shows a scanning electron microscopy (SEM) image of as-deposited platelet structures using 1-pyrenebutyric acid (PyBA) as the surfactant. For a typical synthesis, these sheets are homogeneously deposited across the entire substrate, having 10-50 nm thicknesses and 1-5 μm lengths and widths. In cross-sectional SEM image as shown in FIG. 1(b), the nanostructures are randomly oriented growing off the surface with the largest structures oriented in a near-vertical direction. Transmission electron microscopy (TEM) image shown in FIG. 1(c) reveals that these sheets have a lamellar morphology, where the normal of each lamella is the same as that of the macroscopic platelet. The structure has a periodicity of 3.2 nm and comprises alternating inorganic layers (dark), 0.7-1.0 nm in width, and organic layers (bright), 2.4 nm in width, corresponding to a bilayer of PyBA molecules as shown in FIG. 1(d). Small-angle X-ray scattering ("SAXS") confirmed the highly ordered lamellar structure with d-spacings of 3.2 nm, 1.6 nm and 1.1 nm corresponding to (001), (002) and (003) reflections, respectively, as shown in FIG. 2(a). Fourier-transform infrared spectroscopy (FTIR), as depicted in FIG. 5, showed the presence of PyBA carboxylate stretching frequencies (1,550 cm$^{-1}$ and 1,402 cm$^{-1}$) and a broad —OH stretching band (3,200-3,500 cm$^{-1}$), implying the surfactant is bound as a carboxylate to an —OH-containing lattice.

Figure 6:
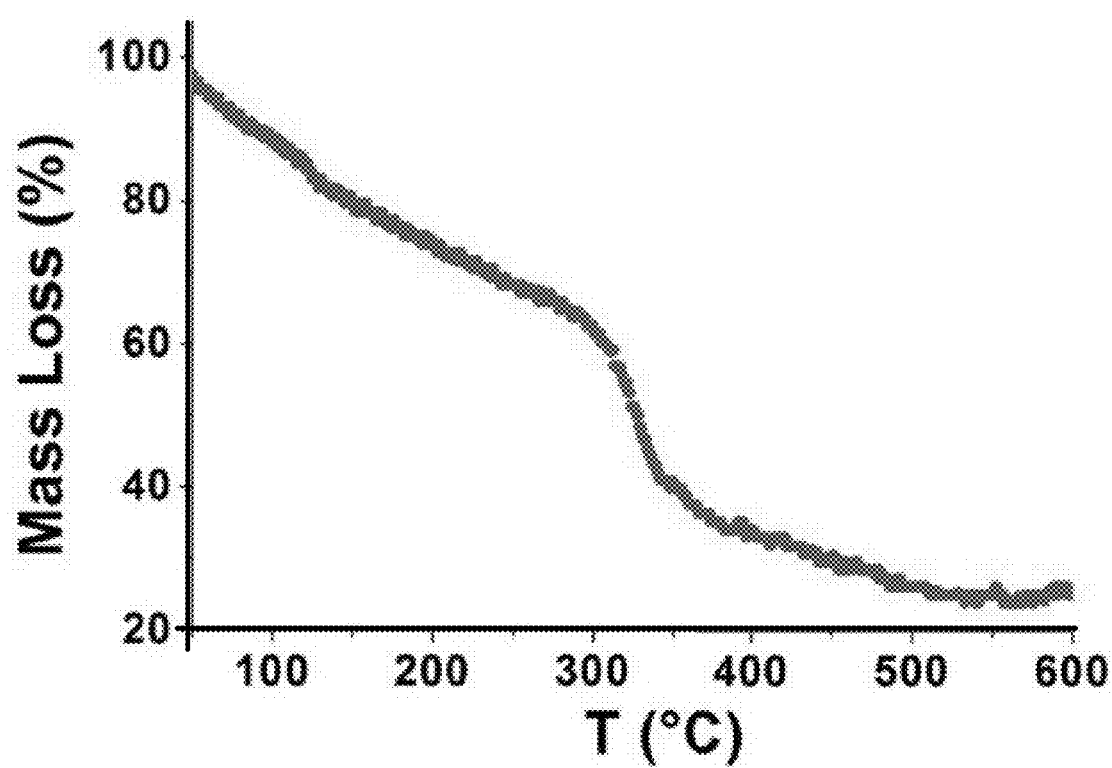
FIG. 6 is an FT-IR spectra of ZnO and PyBA standards, and of electrodeposited film with PyBA.

To identify the stoichiometry of the inorganic phase, temperature-dependent studies were carried out on as-deposited films using PyBA. Thermogravimetric analysis, as depicted in FIG. 6, revealed two distinct mass-loss transitions, a 20 wt % loss above 100° C. and a decomposition onset of the surfactant above 300° C. It was therefore to characterize films annealed at 150° C., and found that the carboxylate anion stretching bands in the FTIR, as depicted in FIG. 5, are still present whereas the O—H stretching band is absent. After annealing to 350° C., the FTIR resembles the spectrum of ZnO nanoparticles. The thermogravimetric analysis thus reveals decomposition of the organic, and the FTIR suggests a transformation occurs within the inorganic phase below 150° C.

Figure 2B:
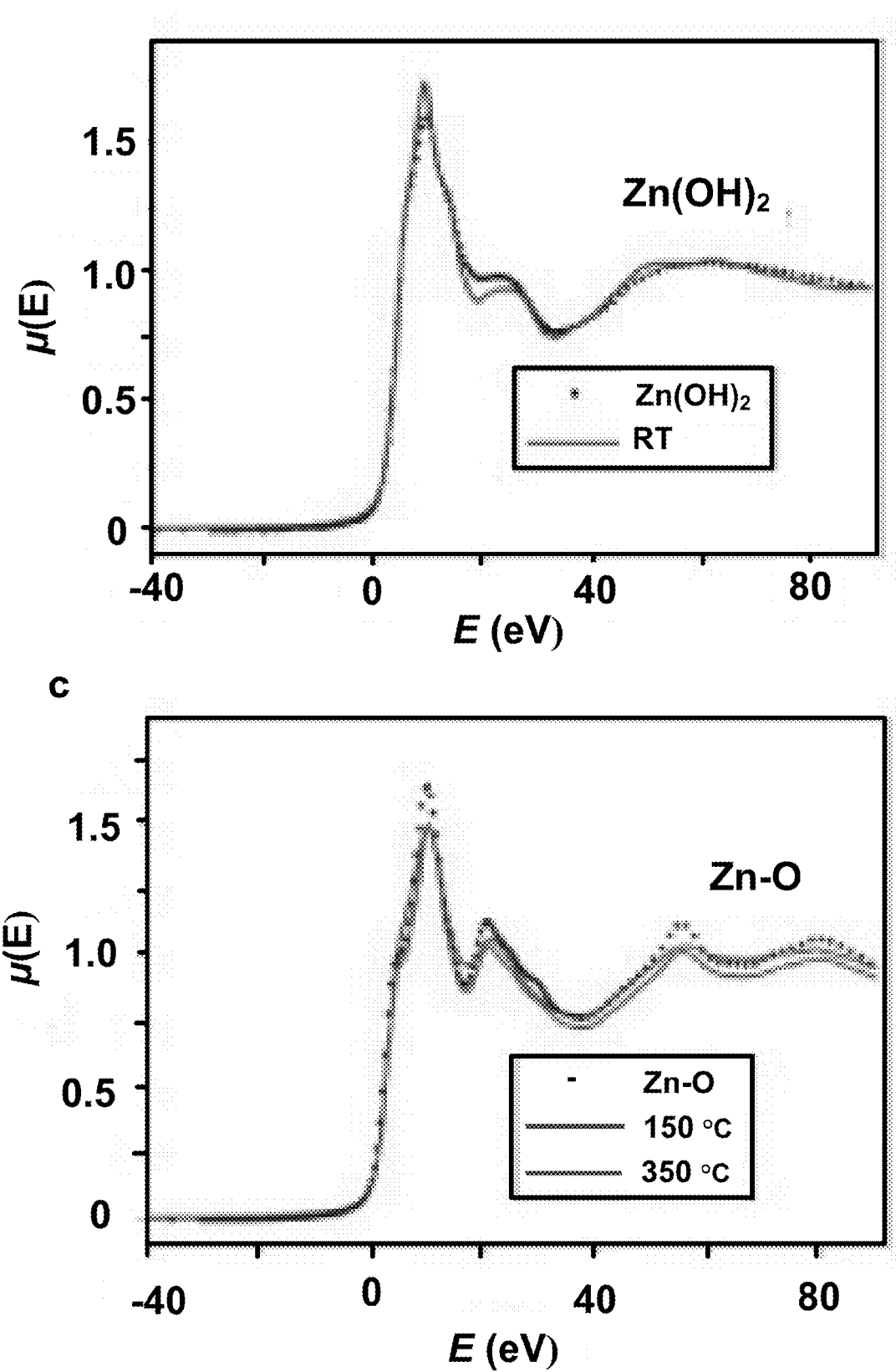
Figure 2C:
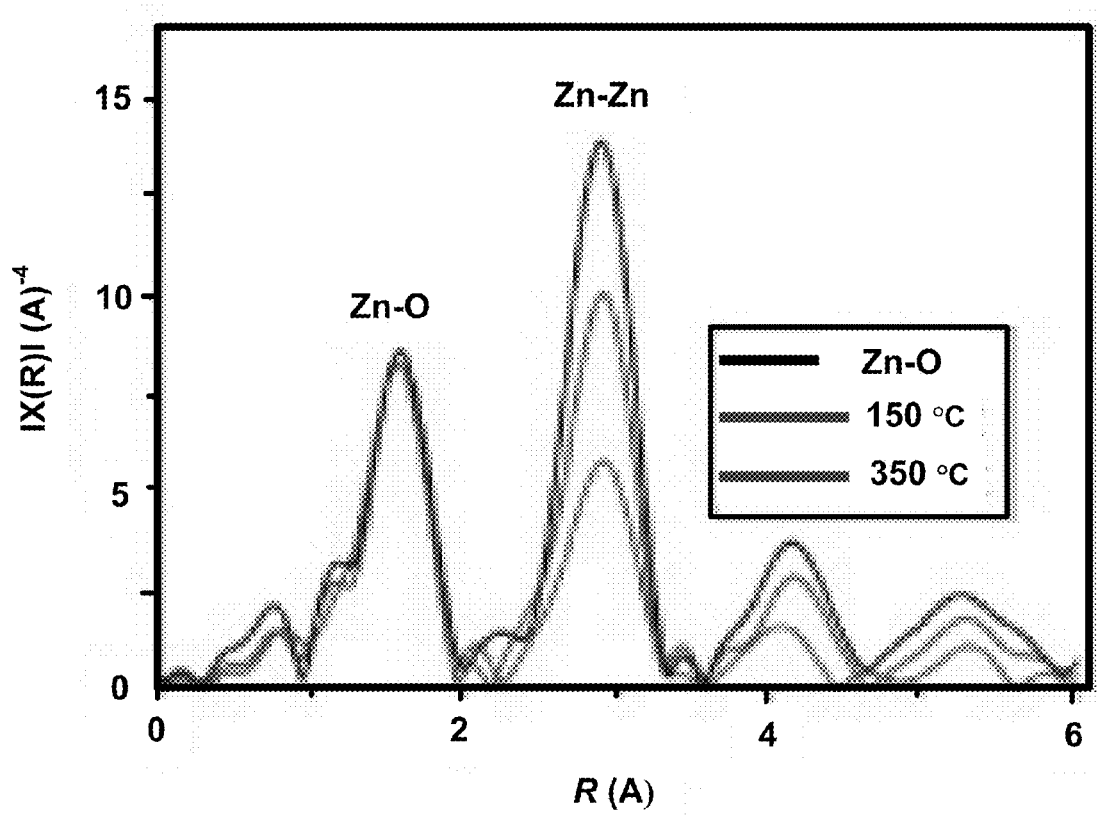

To determine the identity of the inorganic phase at specific temperatures, X-ray absorption spectroscopy (XAS) measurements were collected. The X-ray Zn—K absorption near-edge structure (XANES) and energy position for the as-deposited film is consistent with that of a layered α-Zn(OH)$_2$ polymorph standard as depicted in FIG. 2(b). On annealing the film to 150° C., the XANES reveals the transformation of Zn(OH)$_2$ to ZnO with a structure consistent with a ZnO nanoparticle standard. In the Fourier transform as depicted in FIG. 2(c) and simulation, as depicted in FIG. 7, of the extended X-ray absorption fine structure, little difference is observed for the nearest-neighbour Zn—O bonding distance (from R) and coordination number (from |$^\chi$(R)|) between the ZnO standard and the annealed samples. Therefore, the annealed samples are composed of tetrahedral Zn—O units.

Figure 2D:
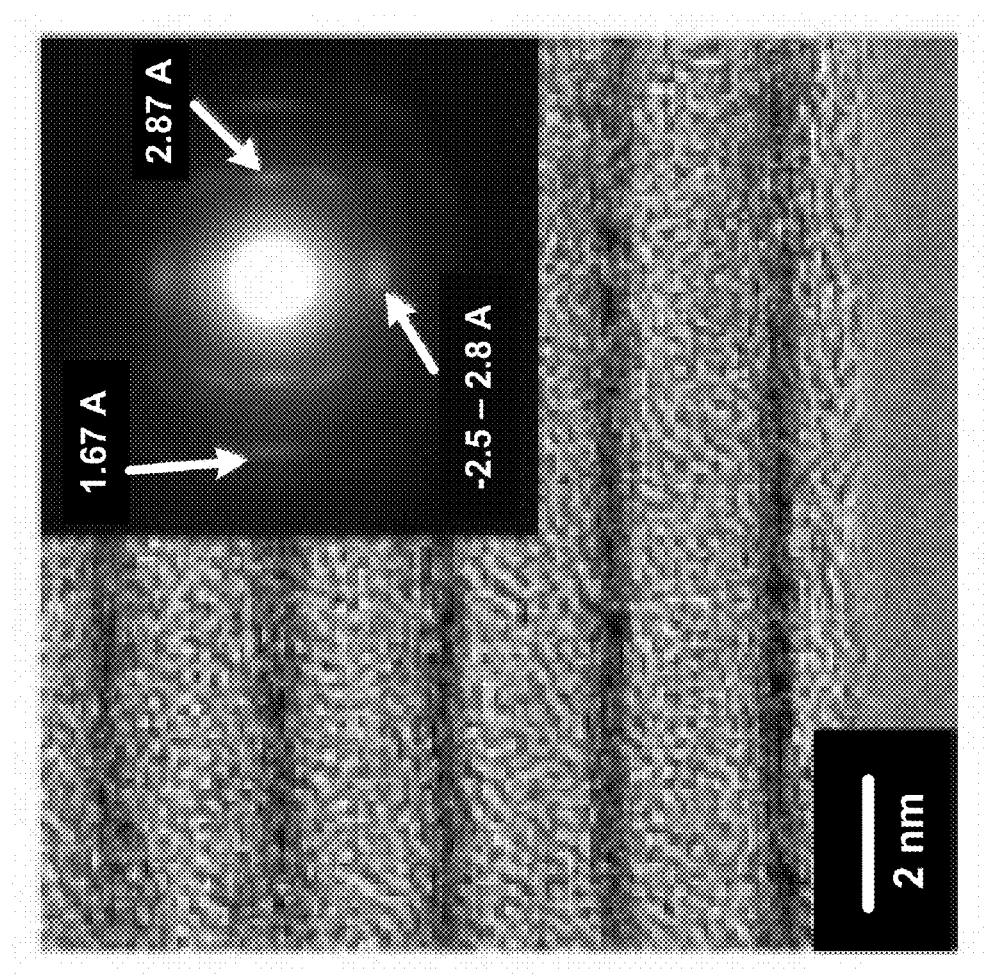
Figure 2E:
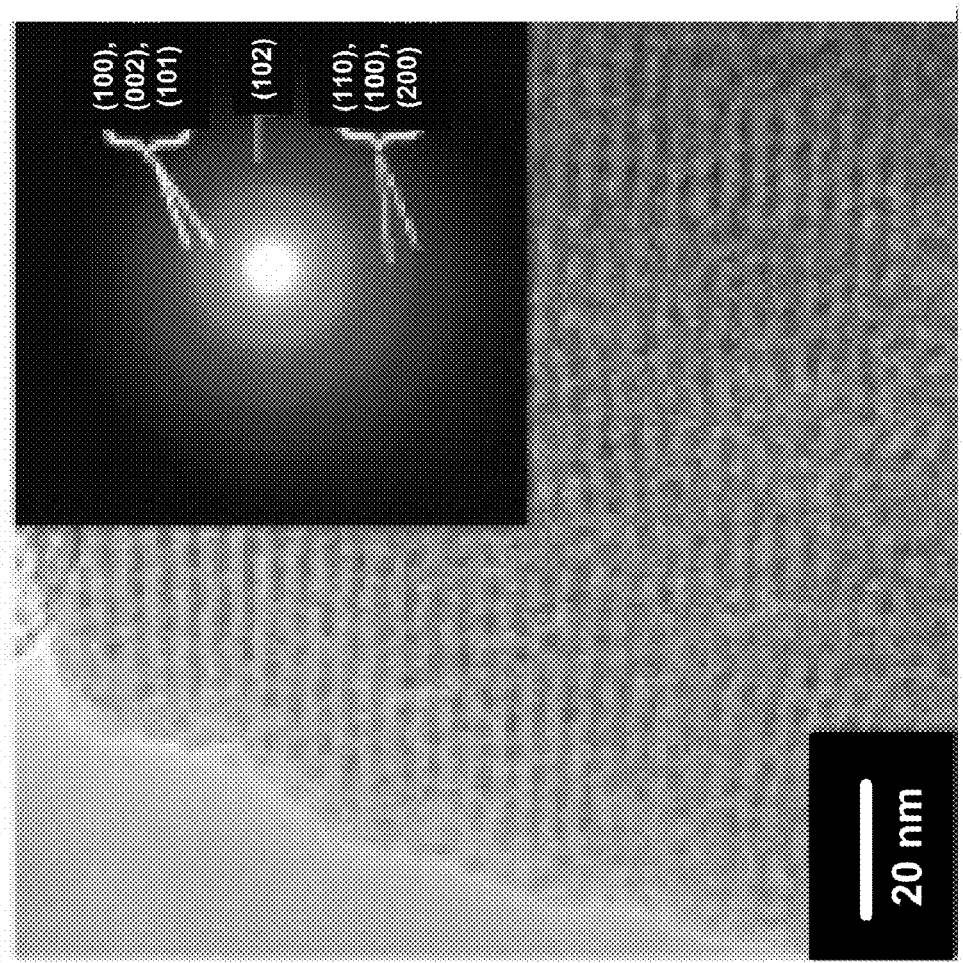
Figure 2F:
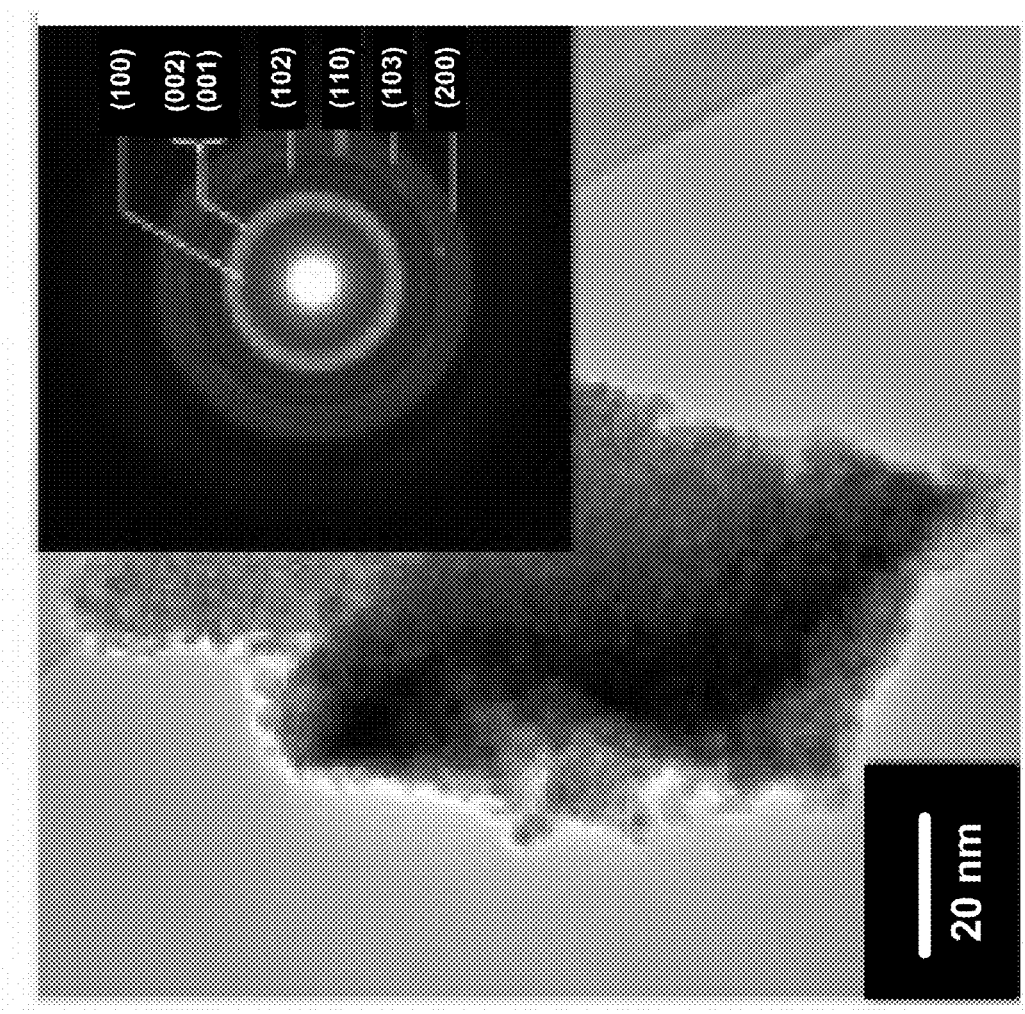
Figure 8:
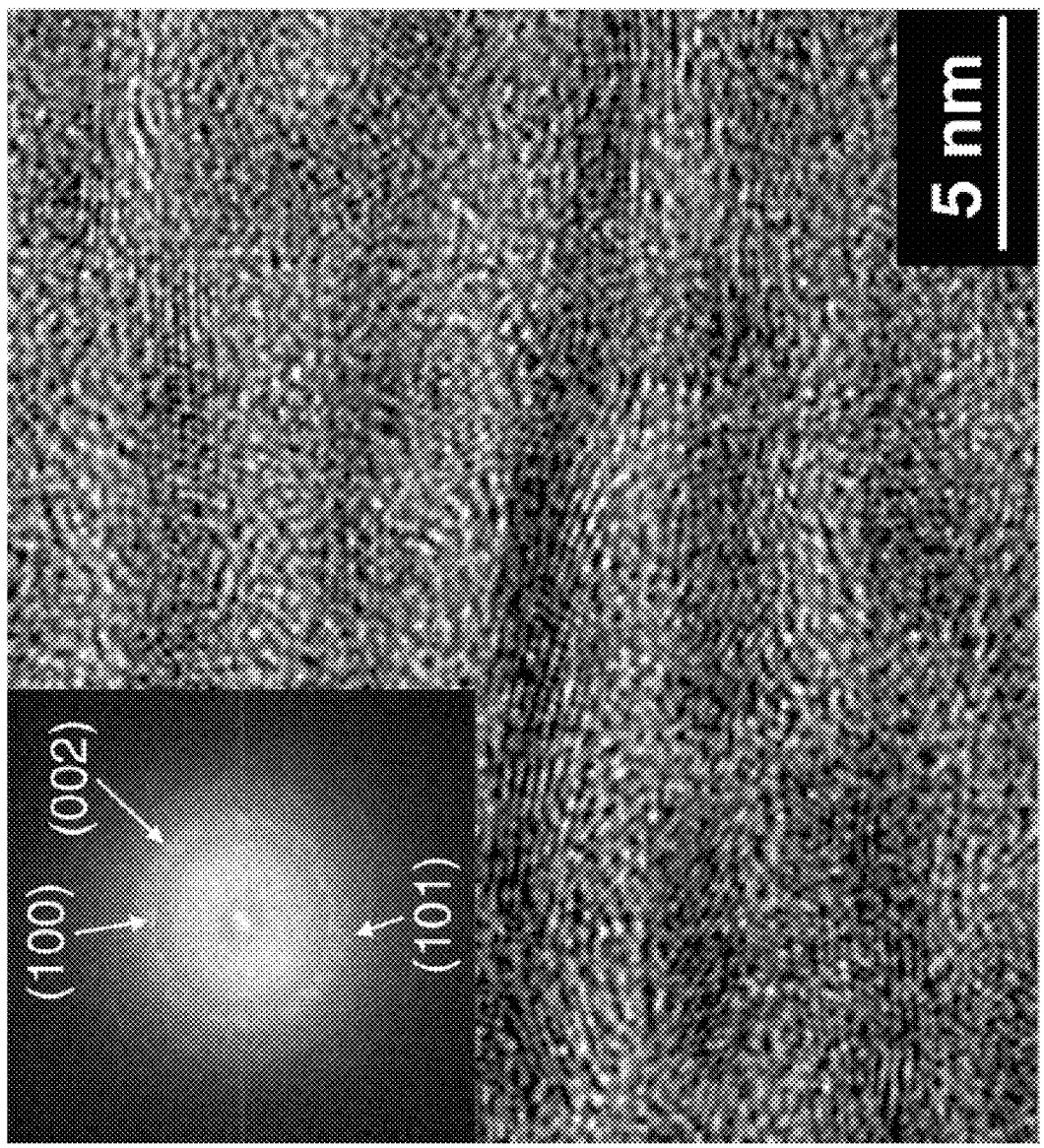
FIG. 8 is a high-resolution TEM image of electrodeposited PyBA/ZnO film after 150° C. heat treatment. Inset shows FFT indexed to wurtzite ZnO.
Figure 9:
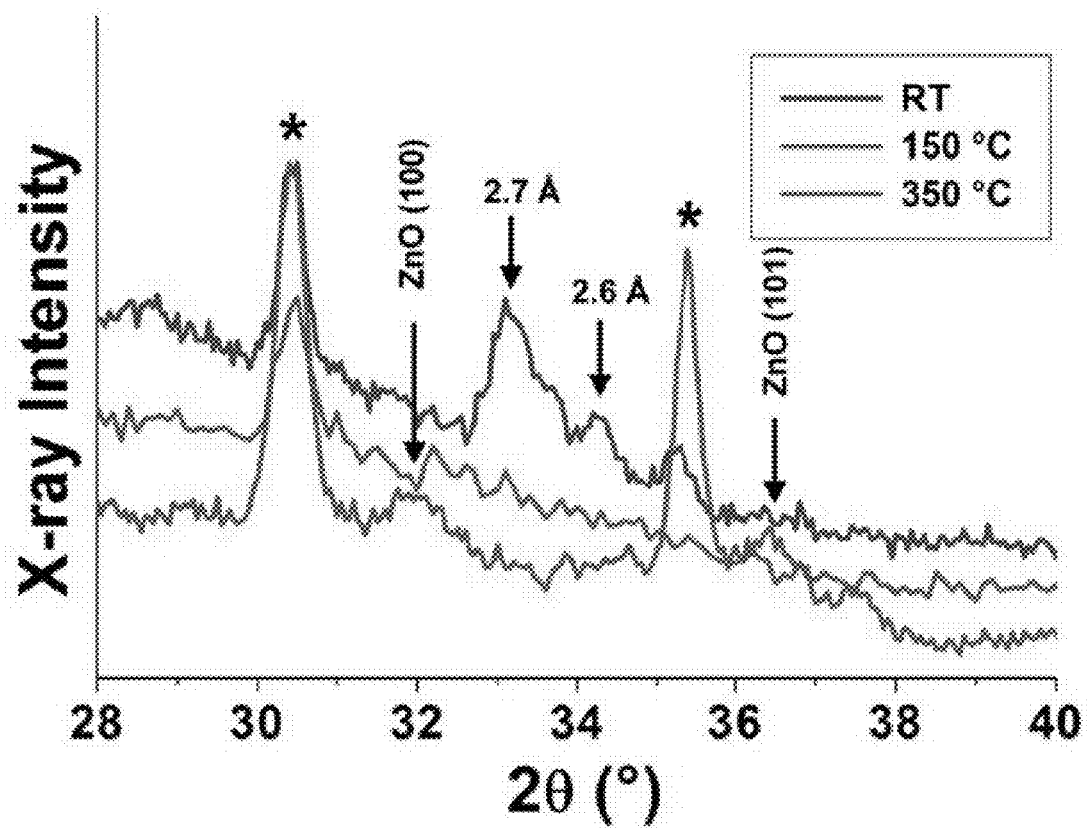
FIG. 9 is a WAXS spectra of electrodeposited film with PyBA before and after heat treatment. ITO substrate peaks indicated by * and wurtzite ZnO peaks indicated by +.

Interestingly, it was found that in hybrids containing PyBA the lamellar structure is preserved during the 100-150° C. conversion[30] from Zn(OH)$_2$ to ZnO. The d$_{001}$ spacing is present, but the higher-order d-spacings disappear in the SAXS of the 150° C.-annealed film as depicted in FIG. 2(a), indicating a decrease in crystallinity of the lamellar ordering. The d$_{001}$ peak is maintained after annealing at 200° C. and 250° C., but annealing at 300° C. leads to a collapse of the lamellar architecture due to decomposition of the surfactant. High-resolution TEM and electron diffraction of the unannealed films shows that Zn(OH)$_2$ is polycrystalline with a preferred orientation, as shown in FIG. 2(d). On annealing to 150° C., the TEM confirms the retention of the lamellar phase throughout the entire sample, as shown in FIG. 2(e). In addition, a small buckling of the lamellar sheets is apparent, probably resulting from volume contraction due to water loss. Therefore, the TEM images may not accurately show if the lamellar ZnO pathways are continuous throughout a single sheet because TEM contrast is strongly dependent on sample orientation and crystallinity. Furthermore, the electron diffraction pattern in FIG. 2e confirms Zn(OH)$_2$ conversion to wurtzite ZnO with no preferential orientation. The intensity of the wurtzite rings is weak, indicative of the <1 nm ZnO polycrystallite size; however, the presence of (002) (101) and (100) lattice spacings can be resolved in the high-resolution TEM, as depicted in FIG. 8. On annealing to 350° C., the lamellar morphology is replaced by larger-grain (diameter>5 nm) ZnO nanoparticles, as shown in FIG. 2(f), with a more well-defined wurtzite crystal electron diffraction pattern. This temperature-dependent behaviour is reflected in the wide-angle X-ray scattering, as shown in FIG. 9.

Figure 10:
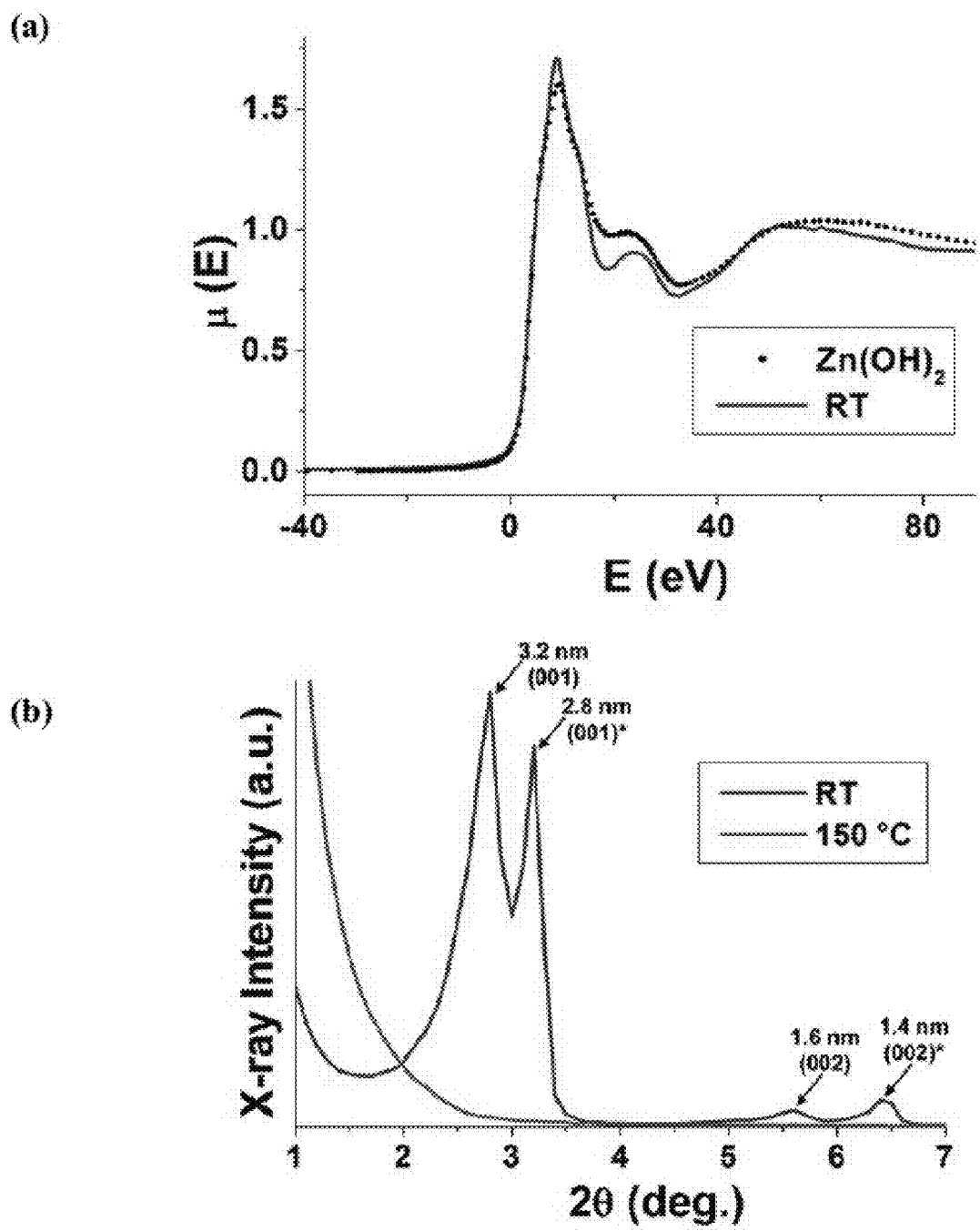
FIGS. 10A and 10B are a SAXS spectra of electrodeposited film with SDS before and after 1 hr. heat treatment (150° C.), and an XANES spectra of $Zn(OH)_2$ powder standard and of electrodeposited hybrid film with SDS and without heat treatment, respectively.
Figure 11A:
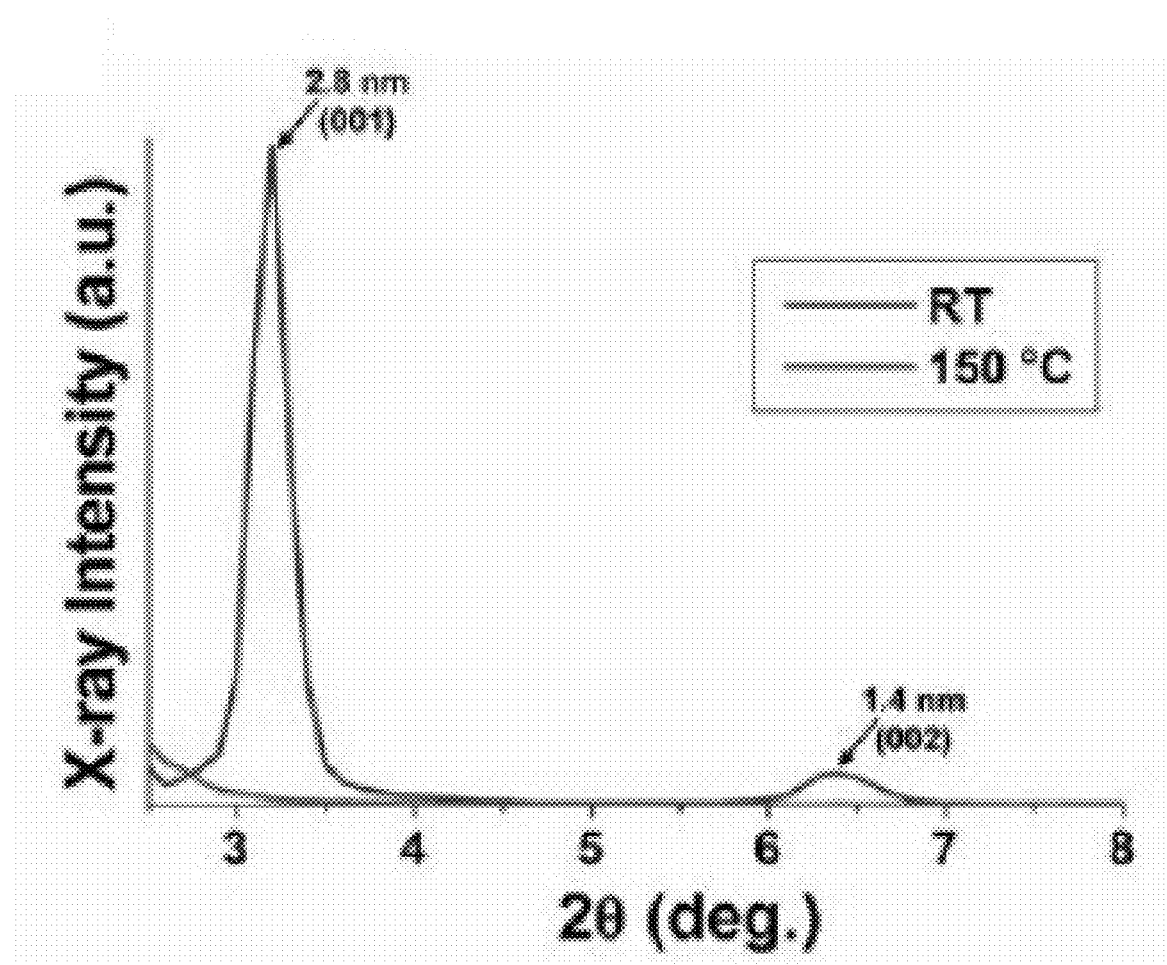
FIG. 11 shows variable-temperature SAXS spectra of electrodeposited hybrid films after heat treatment (150° C.): (a) decanoic acid; (b) PyCA; (c) 3TCA and (d) 5TmDCA. The 10-carbon chain decanoic acid surfactant was used as a comparison to the 12-carbon chain SDS instead of the 12-carbon chain dodecanoic acid due to its poor solubility in the electrolyte solution.
Figure 11B:
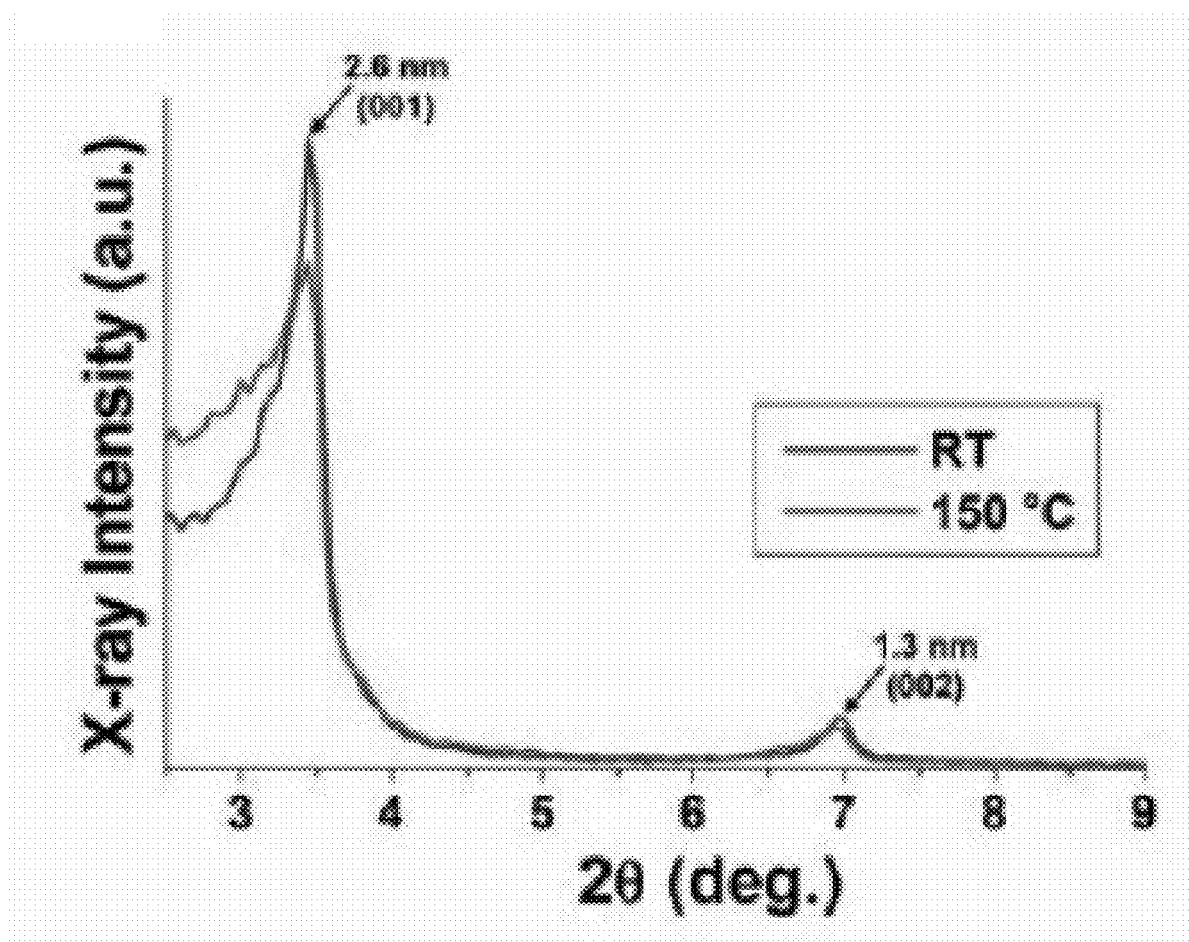
Figure 11C:
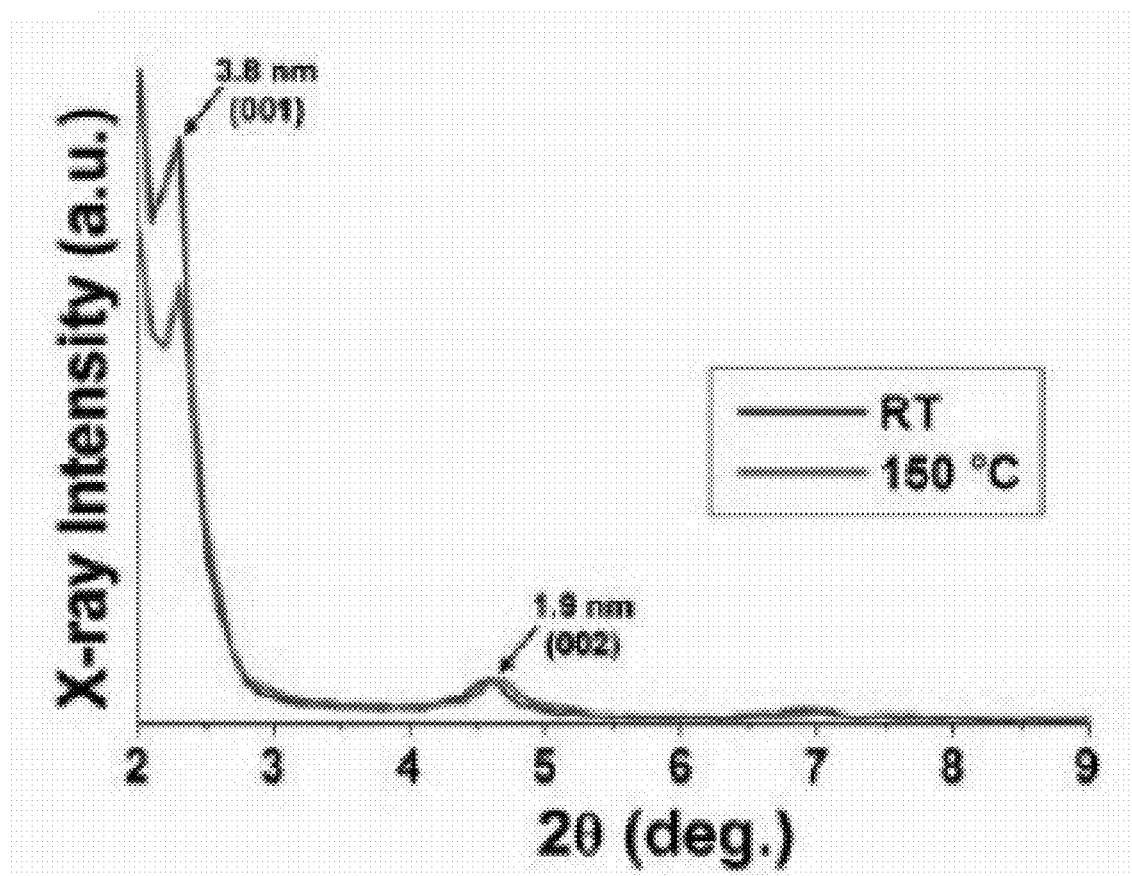
Figure 11D:
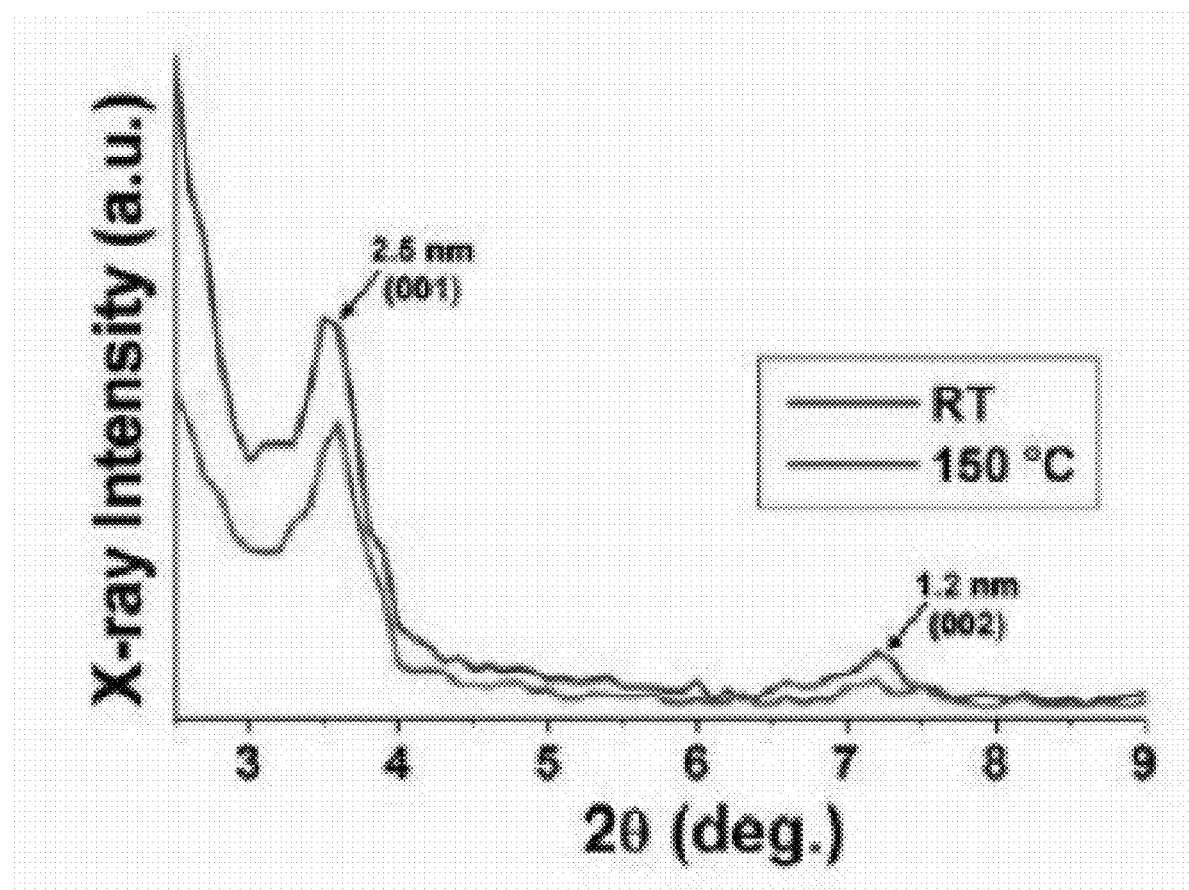
Figure 12:
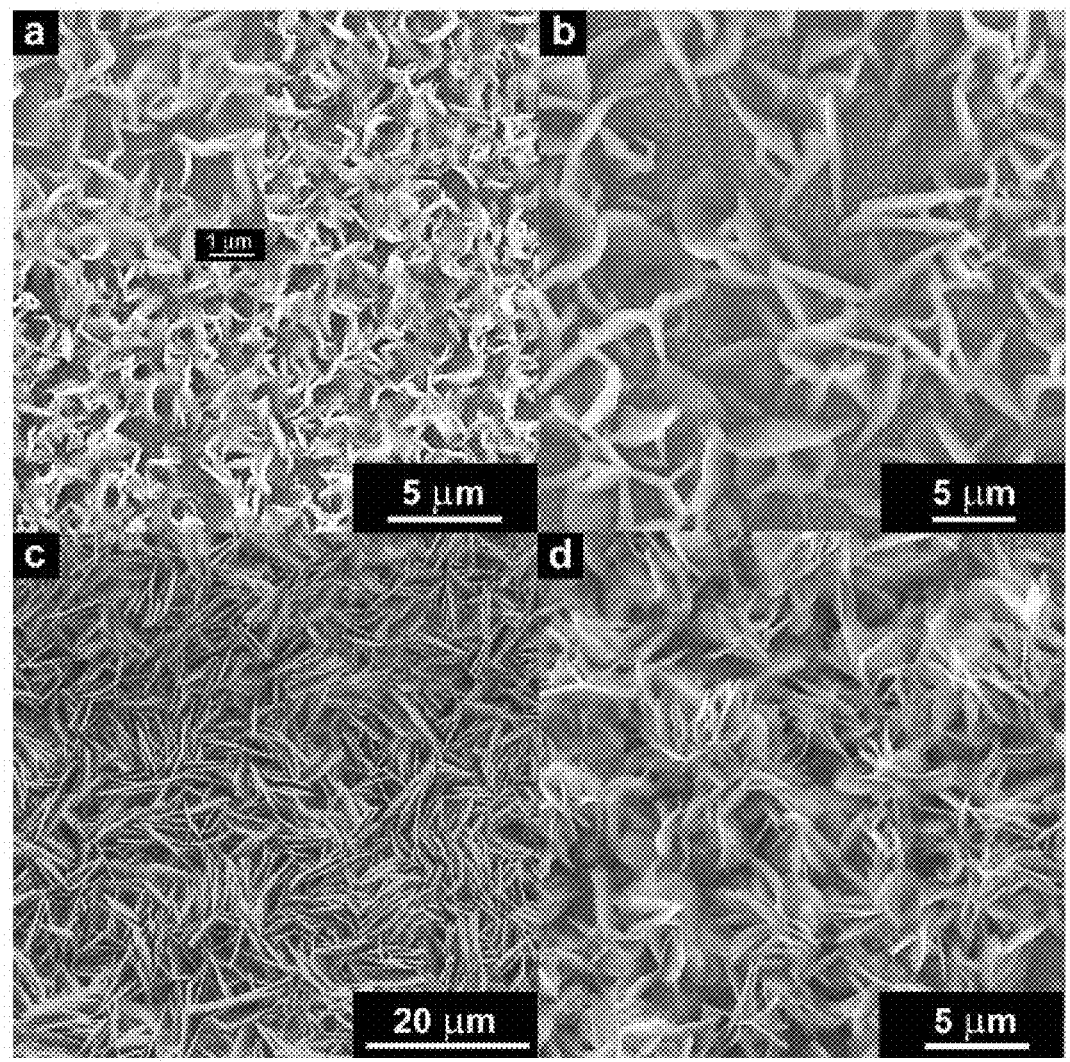
FIG. 12 shows SEM images of electrodeposited hybrid films: (a) SDS (with inset of magnified view); (b) decanoic acid; (c) PyCA; and (d) 3TCA, respectively.

In contrast to the sol-gel synthesis of mesoporous oxides[31], the organic in the system provided according to one embodiment of the present invention is necessary to retain the lamellar morphology when Zn(OH)$_2$ transforms to the semiconducting oxide. To elucidate the role of conjugated surfactants on nanostructure integrity, films were electrodeposited using the previously studied, non-conjugated sodium dodecyl sulphate[20, 21, 32] (SDS). In these films, the XANES, as shown in FIG. 10(a), indicates that the insulator Zn(OH)$_2$, not the semiconductor ZnO, predominates at room temperature. However, annealing to 150° C. leads to a complete collapse of the lamellar nanostructure, as shown in FIG. 10(b), consistent with previous reports[20]. To determine if the head group influences the nanostructure stability, films were electrodeposited with decanoic acid. In this case, the lamellar morphology also decomposes on annealing to 150° C., as shown in FIG. 11(a). Therefore, π-π stacking interactions among the surfactant molecules and not binding strength between the surfactant head group and the inorganic framework is crucial to the thermal stability of the lamellar architecture during conversion. Indeed, hybrid films containing different conjugated surfactants, including pyrene carboxylic acid and terthiophene carboxylic acid (as shown in Table 1), also retain the lamellar nanostructure after annealing, as shown in FIGS. 11 and 12, respectively. In previous electrodeposition studies of ZnO using conjugated surfactants, the same molecular-scale lamellar structures were not achieved, as did in practicing the present invention. This may be due to the use of a significantly lower (two orders of magnitude) molar ratio of surfactant/Zn, or the chemical structures of the surfactants[33].

Figures 3A, 3B:
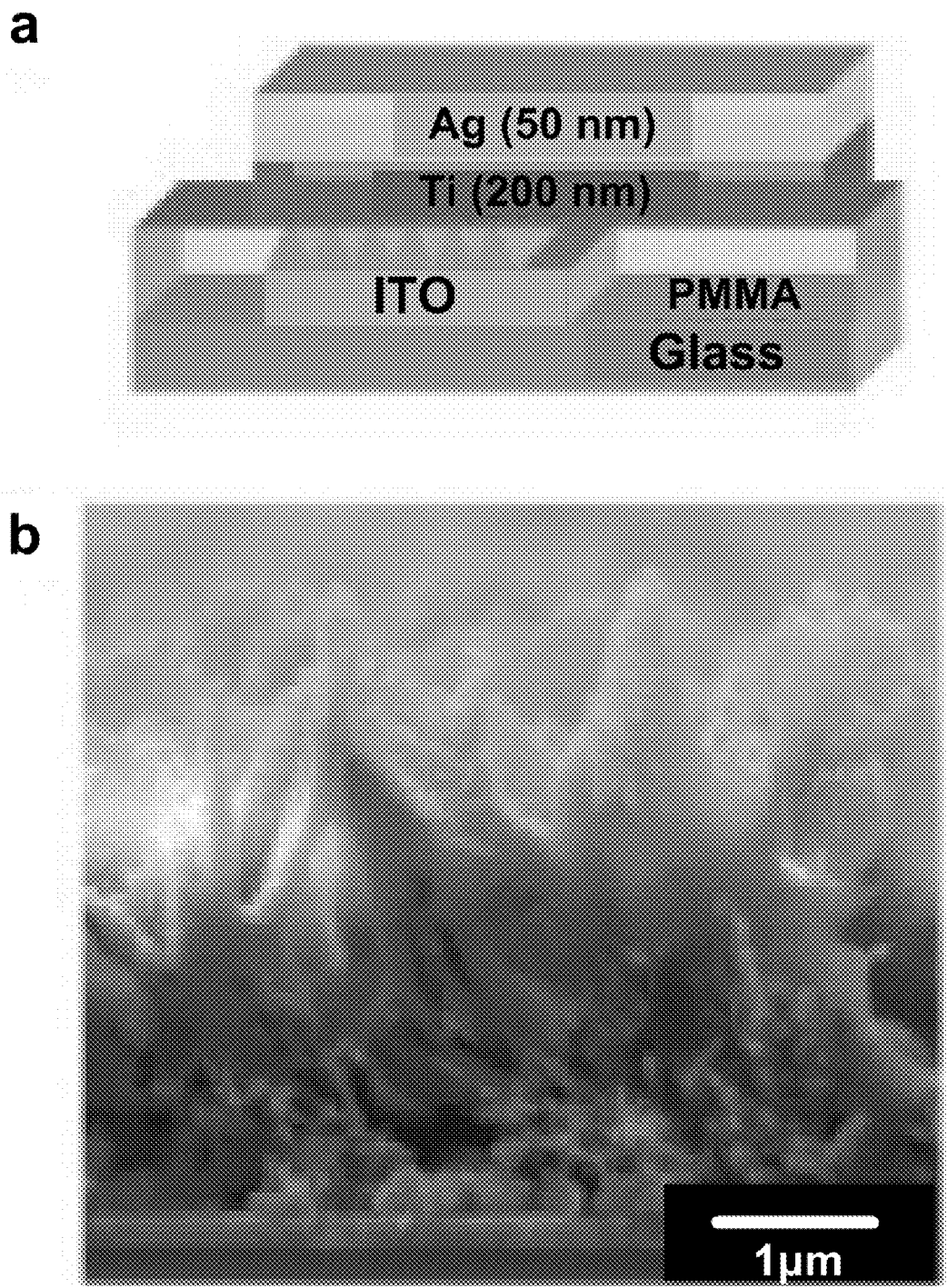
FIG. 3 relates to optoelectronic properties of hybrid PyBA nanostructures: (a) Schematic diagram of fabricated devices. PMMA: poly(methyl) methacrylate; (b) SEM (cross-sectional view) image of final device; (c) I-V curves of deposited hybrid films with PyBA before ($Zn(OH)_2$) and after 150° C. annealing (ZnO) under dark and ultraviolet light ($\lambda=365$ nm); (d) Photographs of devices (top) and photoluminescence spectra (bottom) on 365 nm excitation before (blue) and after 150° C. annealing (red). Inset: Energy level diagram of pyrene and ZnO system.
Figure 3C:
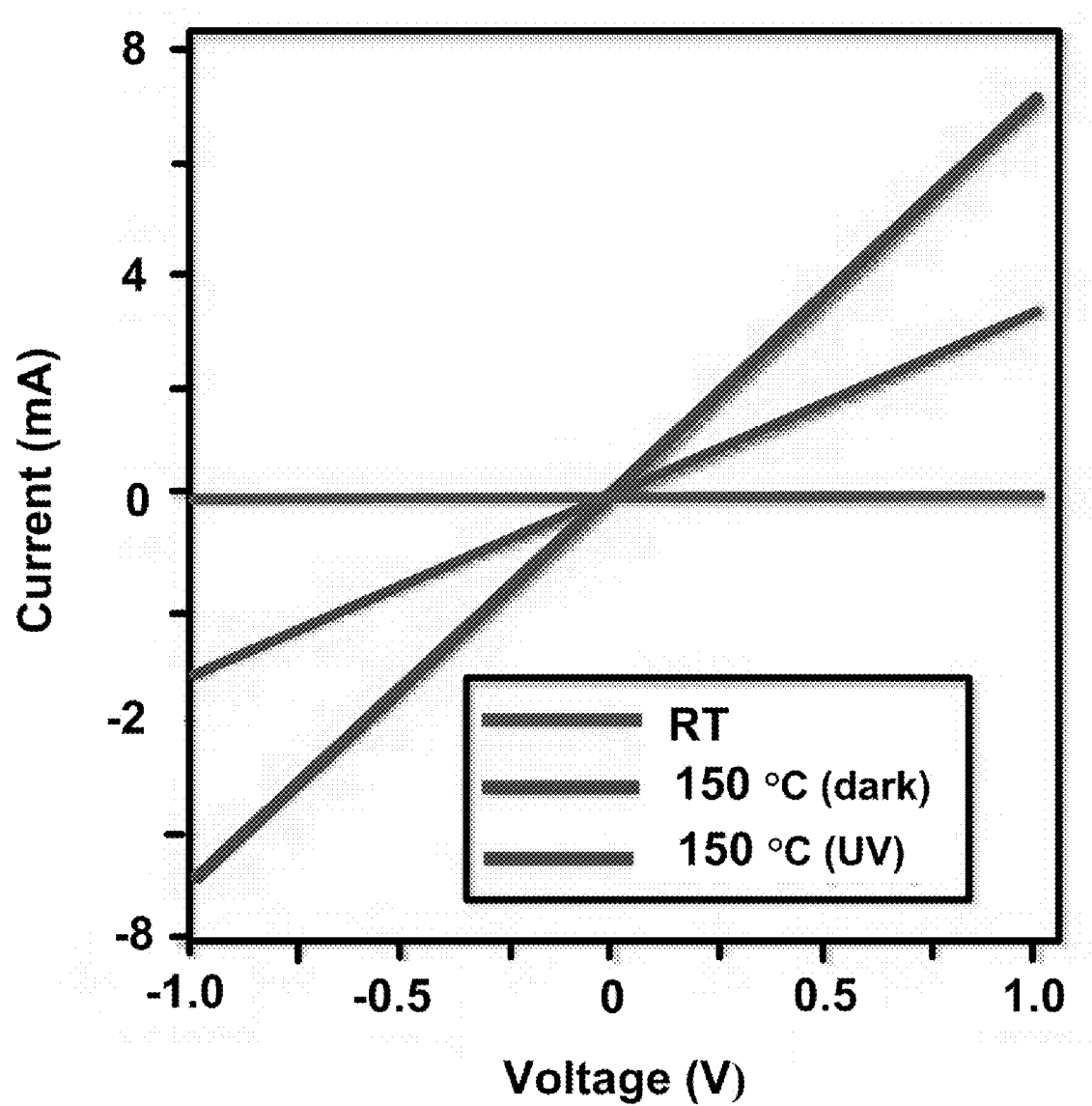
Figure 3D:
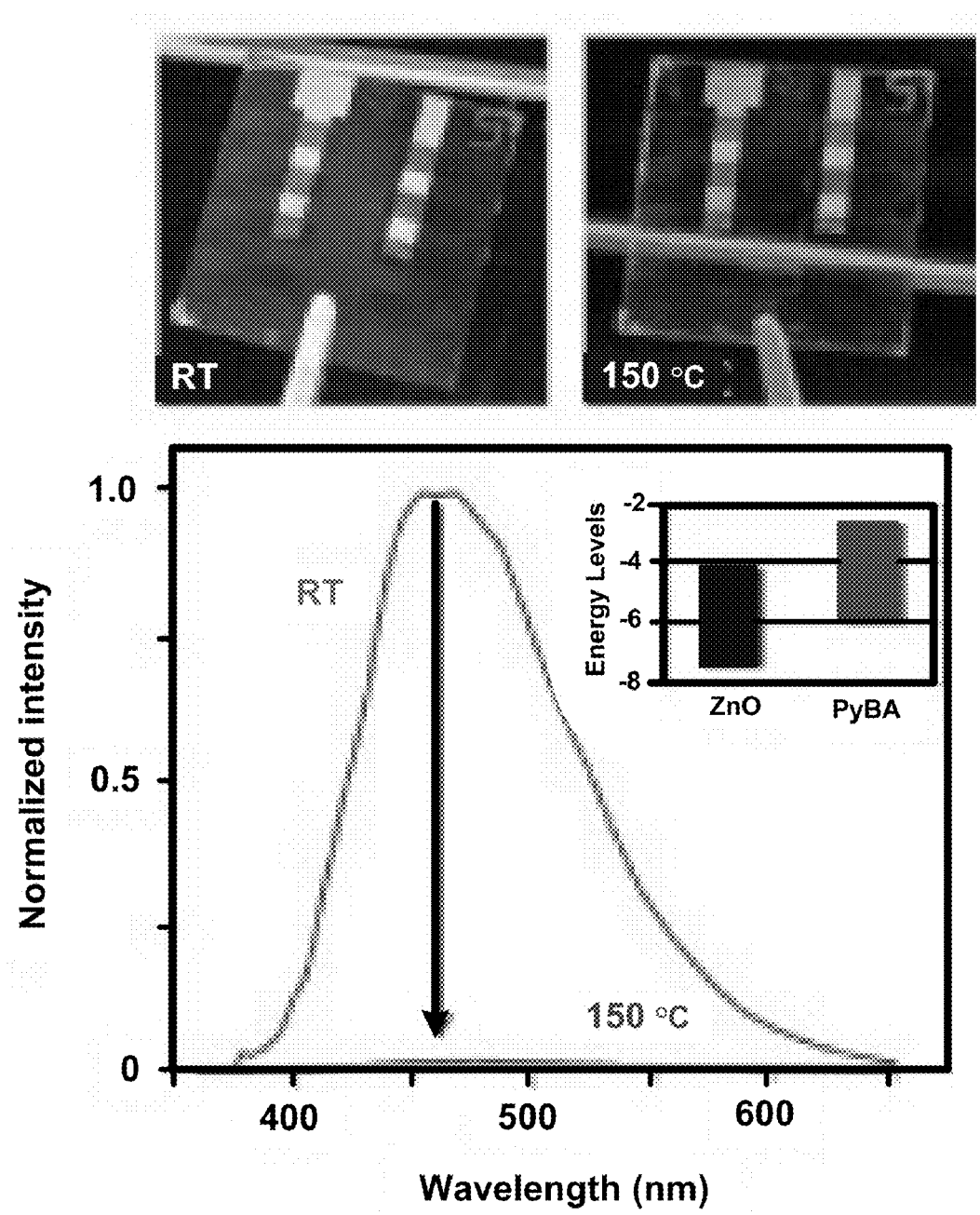
Figure 13:
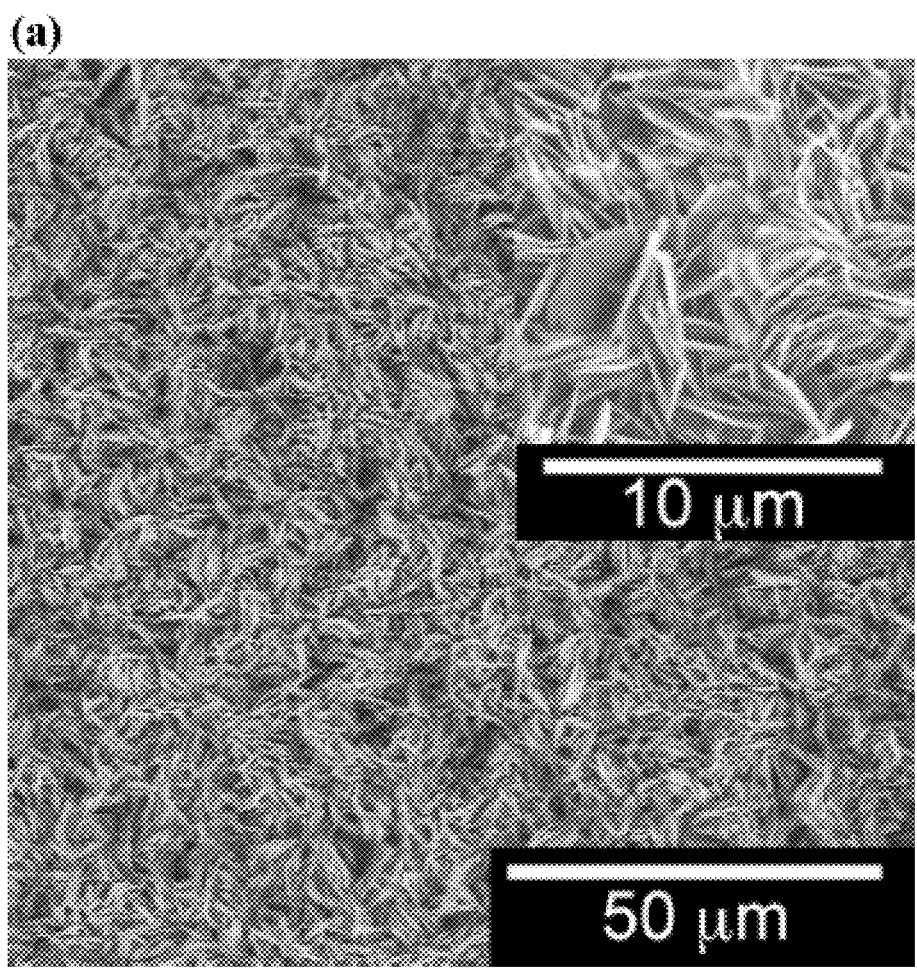
FIG. 13 shows SEM images of electrodeposited hybrid films: (a) Top down and (inset) zoomed in SEM image; and (b) cross-sectional SEM image of a hybrid lamellar PyCA film, highlighting vertical alignment and extremely dense growth. With a thickness of 6.5 um thick, the estimated surface roughness (area of ZnO surface/area of substrate) including the internal surface area of each sheet lamellar is 37,500×.
Figure 13:
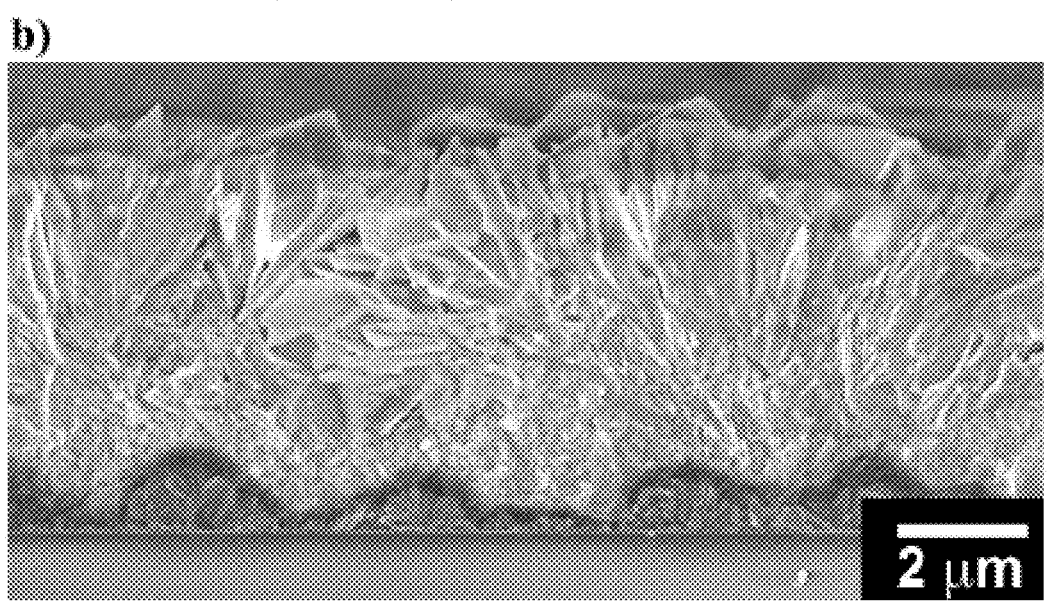

Extremely dense, vertically oriented growth of these lamellar hybrids can be attained with optimal growth conditions, as shown in FIG. 13, enabling their integration into numerous optoelectronic applications. To do so, it was further addressed whether electron conduction pathways can be formed in the <1 nm ZnO layers. Two-terminal measurements on bulk thin-film samples were carried out as shown in FIG. 3 (a, b). I-V measurements of the unannealed Zn(OH)$_2$/PyBA film showed no significant current above noise (r>10$^{12}$ Ωcm), even under optical excitation with ultraviolet light. On annealing at 150° C., a nine order of magnitude increase in conductivity was observed, revealing ohmic behaviour. The average resistivity from 10 devices is 8.1±1.9×10$^3$ Ωcm, similar to previous values of sintered polycrystalline ZnO[34]. A significant photoconductive response was observed using above ZnO bandgap light as shown in FIG. 3(c). In addition, the fluorescence of the pyrene excimer is quenched by two orders of magnitude on thermal conversion to the oxide, as shown in FIG. 3(d), in contrast with the intense fluorescence observed for crystalline pyrene[35]. Control fluorescence and $^1$H NMR experiments suggest that this photoluminescence quenching is not due to oxidation of the PyBA as discussed more in detail below. This quenching is therefore indicative of electron transfer from the pyrene excited state into the ZnO lattice, consistent with the energy level diagram (as shown in FIG. 3(d), inset)[36].

Figure 4A:
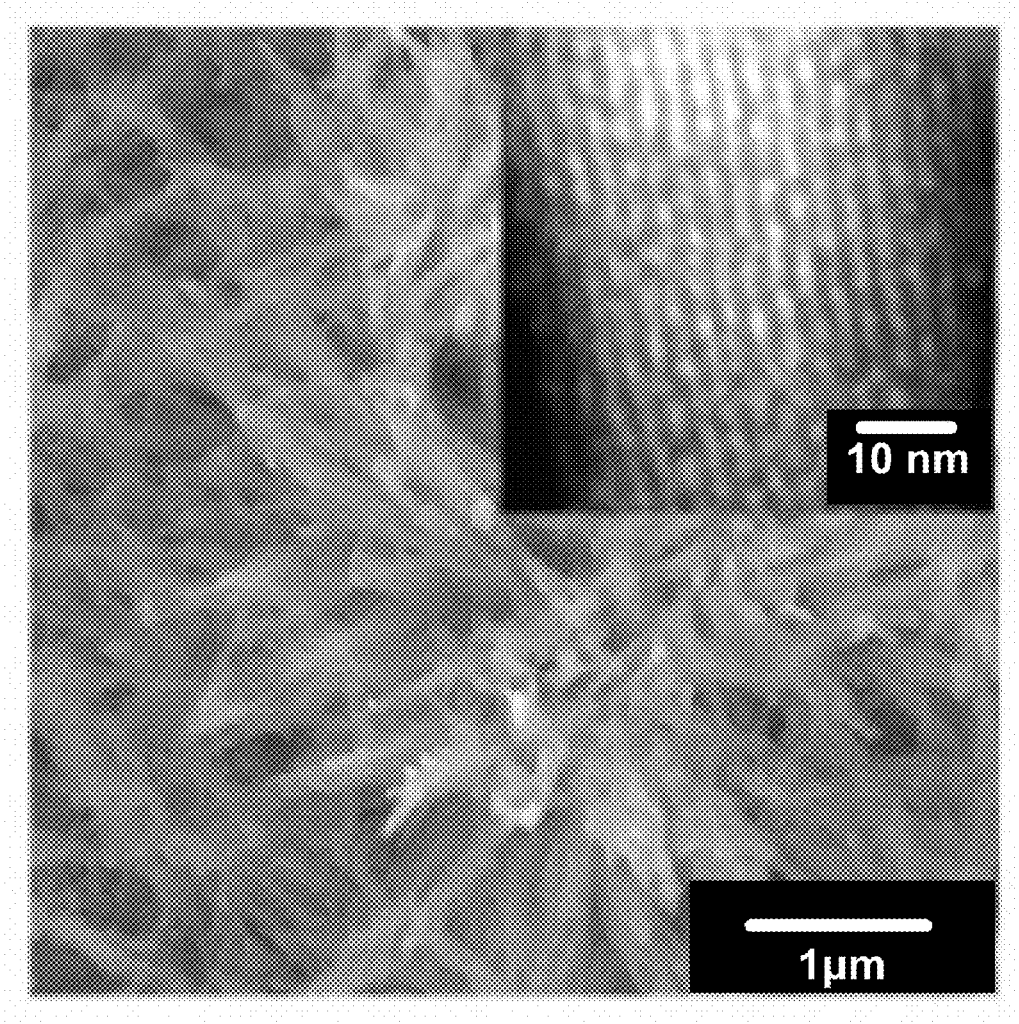
FIG. 4 relates to structure and photoconducting properties of resulting nanostructures using 5TmDCA: (a) SEM image of deposited fibres. Inset: Scanning TEM image of lamellar ordering composed of alternating inorganic Zn-rich (light) and quinquethiophene (dark) layers; (b) I-V curves of a photoconducting device measured in dark and under white light (~100 mW cm$^{-2}$). Top inset: Photograph of a fabricated device. Bottom inset: Time-dependent conductivity measured at 1 V showing photoresponse on excitation with 500 nm light (410 µW cm$^{-2}$); (c) Ultraviolet-visible absorption and spectral responsivity (left and right vertical axis respectively as indicated by arrows) measured at 1 V. For the spectral responsivity, the irradiance at each wavelength ranged between 160 and 440 µW cm$^{-2}$ depending on the wavelength. Inset: Energy level diagram of the 5TmDCA and ZnO system showing electron transfer; (d) Photocurrent versus optical illumination, revealing a dynamic range of greater than three orders of magnitude or 60 dB, as measured at 500 nm excitation; (e) Gain and detectivity (left and right vertical axis respectively as indicated by arrows) as a function of wavelength, measured at 1 V. The irradiance at each wavelength ranged between 8 and 22 µW cm$^{-2}$ for all wavelengths. Inset: Gain versus irradiance for the 500 nm wavelength under these same conditions; and (f) Detectivity measured at 2 V and 500 nm excitation (4 µW cm$^{-2}$) as a function of modulation frequency.
Figure 14:
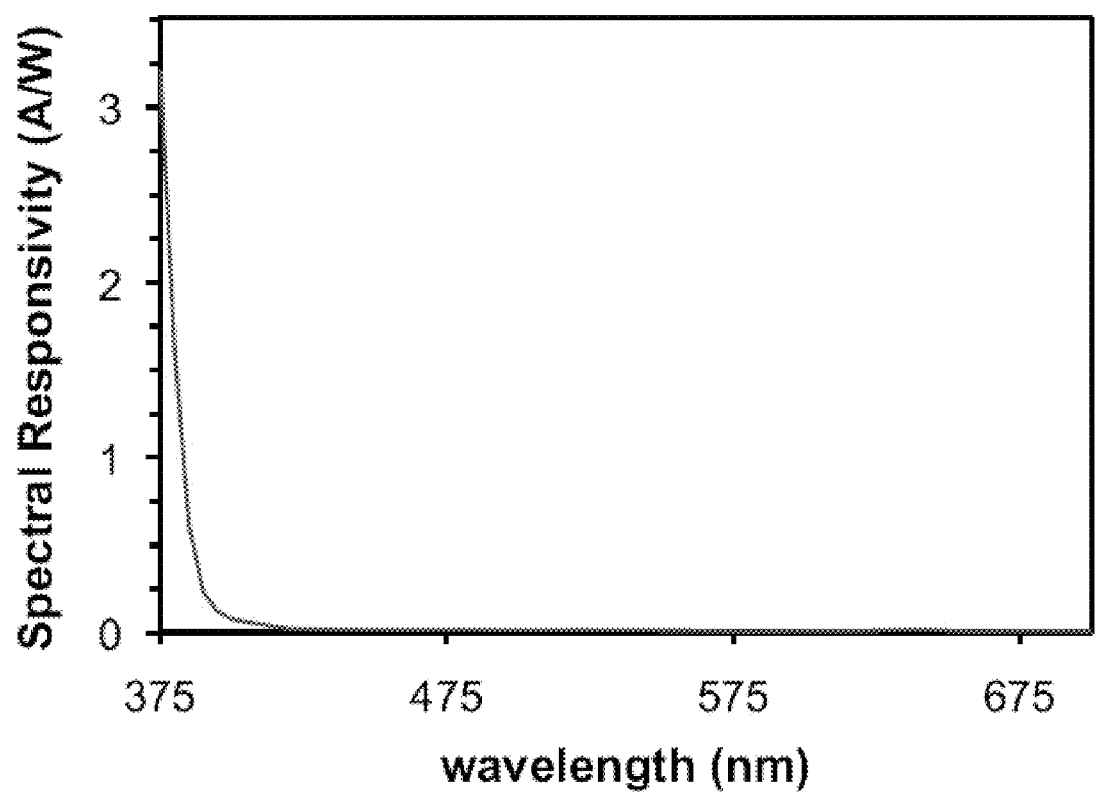
FIG. 14 shows a spectral responsivity of PyBA photodetector. Sample was measured at 1 V, at a spectral irradiance which varied from 160 to 440 µW/cm2 depending on the wavelength.
Figure 15:
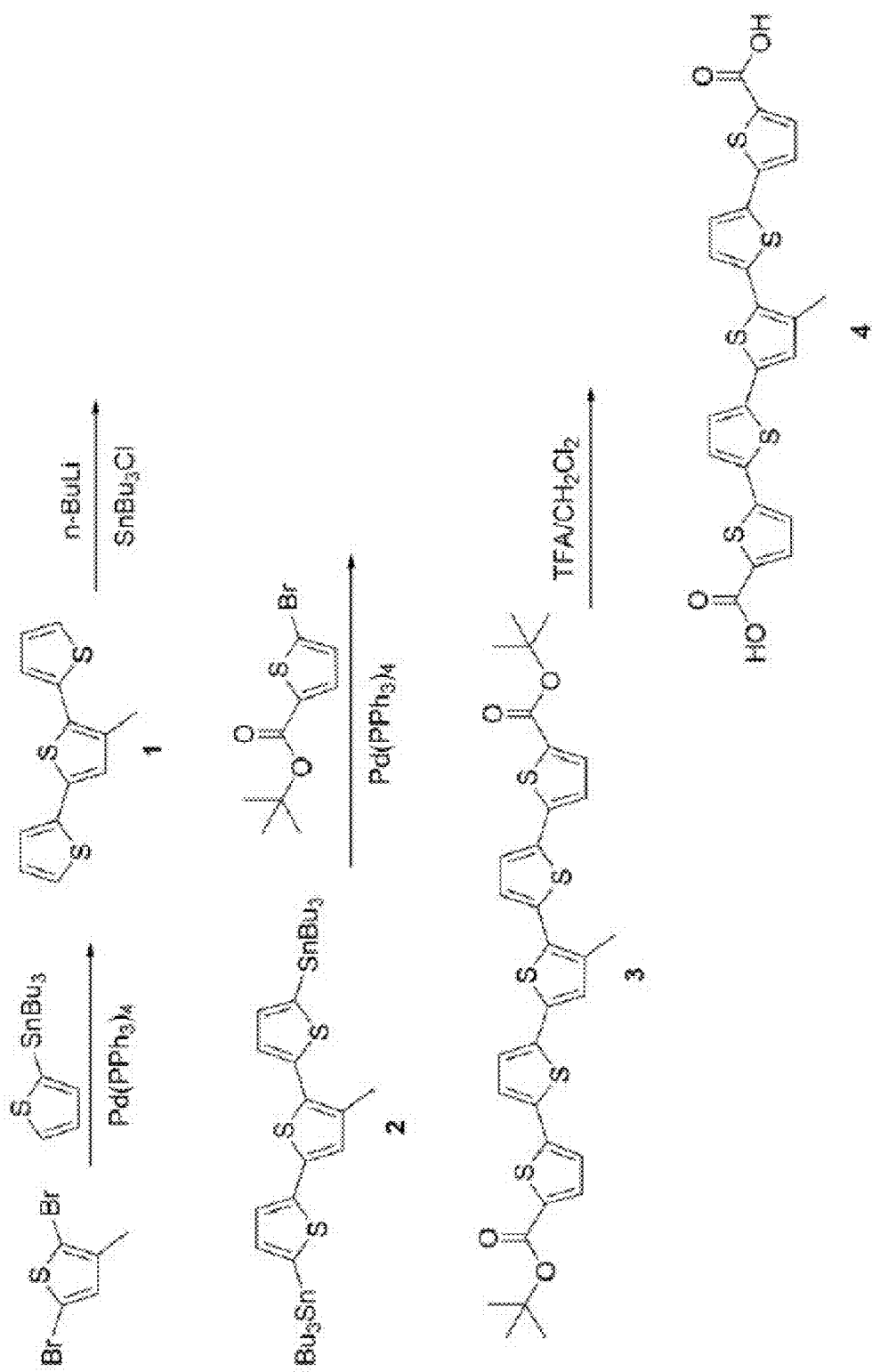
FIG. 15 is a chemical synthetic scheme for 5TmDCA: synthesis of Quinquethiophene Dicarboxylic Acid (5TmDCA) Bolaamphiphile.

These results obtained by practicing the present invention in various embodiments show that the <1 nm polycrystalline ZnO matrix forms excellent conduction pathways for charge transport. The spectral responsivity of ZnO/PyBA hybrids, as shown in FIG. 14, shows a peak response below 370 nm with no detectable photoresponse above 420 nm. This lack of visible photoresponse is expected because pyrene absorption occurs at energies higher than the ZnO bandgap (3.37 eV, 367 nm). To extend the usefulness of this lamellar architecture and prove that the organic has a functional role for photodetection, it was further explored tuning the spectral responsivity by synthesizing novel surfactants. Therefore, a surfactant containing a conjugated moiety with an absorption energy onset below the ZnO bandgap was designed. It was synthesized a dicarboxylic acid 3-methyl-quinquethiophene (5TmDCA), as shown in FIG. 15, designed as a bola-amphiphile to aid in solubility. Interestingly, electrodeposition using this surfactant resulted in fibre-like (FIG. 4a) rather than previously observed flake-like morphologies. Scanning TEM, as shown in FIG. 4(a), and SAXS, as shown in FIG. 11, confirmed well-defined lamellar ordering with a periodicity of 2.5 nm that is retained on annealing above 150° C. The smaller spacing is attributed to the organic region being composed of single layers, because each molecule has two carboxylic acid binding sites. On the basis of the 2.4 nm extended molecular length, it is suggested that the molecules pack in a tilted herring-bone structure, as is well documented for thiophene oligomers in lamellar packing motifs[37]. The presence of sulphur in the organic enabled the inventors to determine the surfactant/Zn stoichiometry through energy-dispersive X-ray spectroscopy (EDS) analysis. EDS on 10 lamellar sheets yielded a S/Zn atomic ratio corresponding to 1.04±0.05 organic molecules per atom of Zn. There is no statistically significant change in the observed 5TmDCA/Zn (1.013±0.019) ratio after annealing at 150° C. To the best of knowledge of the inventors, this corresponds to the largest reported loading density of chromophores bound to a polycrystalline nanoparticle network, highlighting the large number of surface atoms in the system according to the present invention. Achieving this sensitization ratio with a network of unfused spherical ZnO nanoparticles would require using 1.4-nm-diameter nanoparticles, the synthesis of which has not been reported.

Figure 4B:
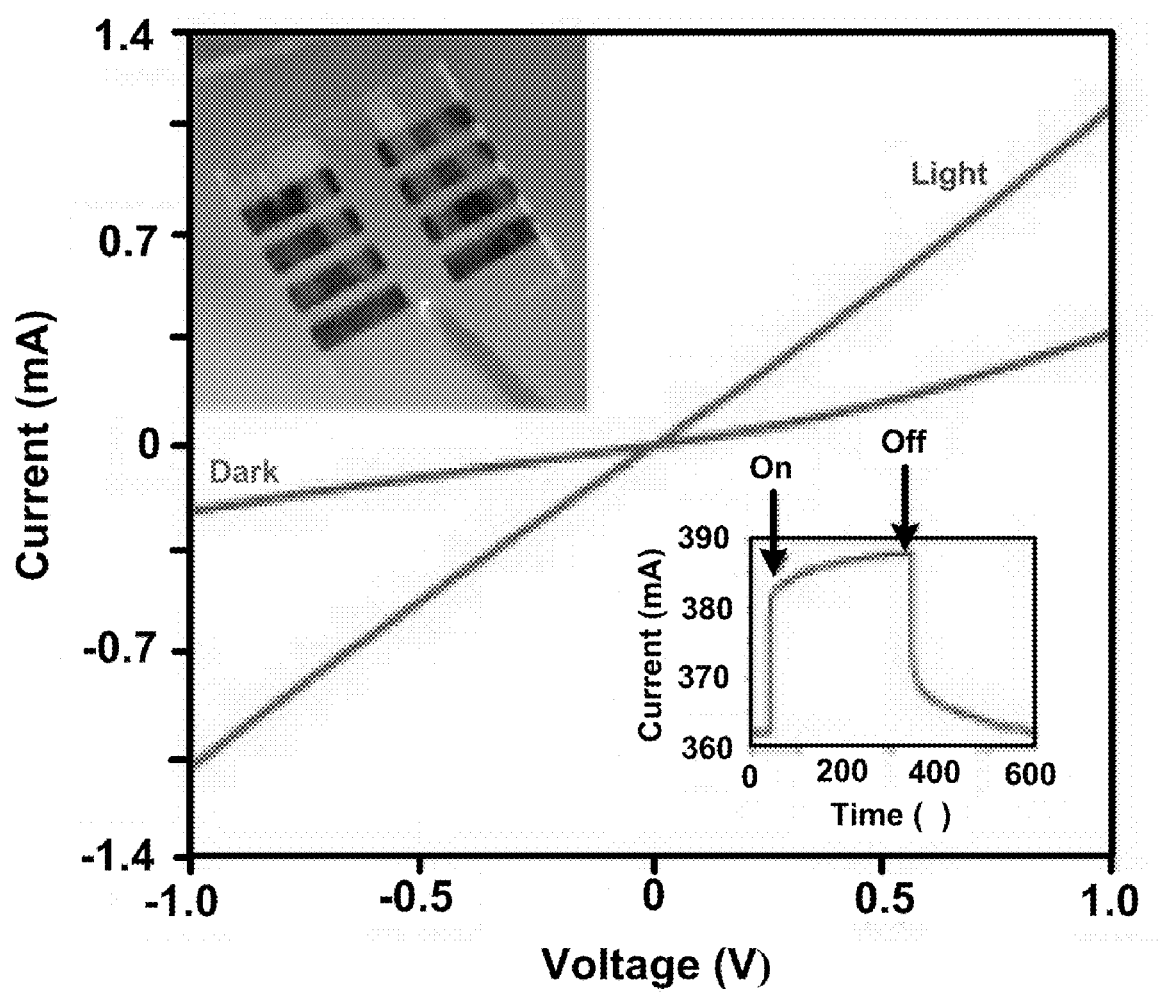
Figure 4C:
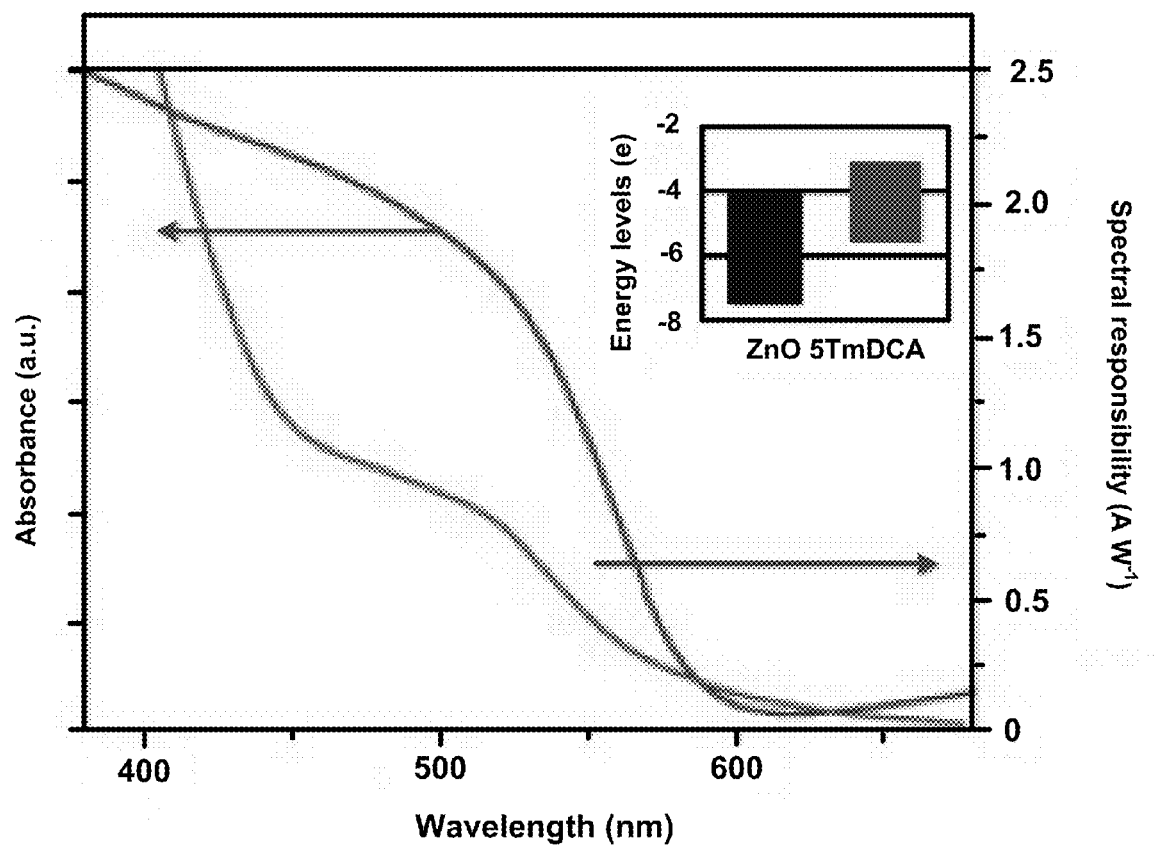

Two-terminal ZnO/5TmDCA photoconductor devices were fabricated similar to the ZnO/PyBA hybrids (as shown in FIG. 4(b), top inset). The average dark resistivity from seven devices is 4.8±2.2×10$^4$ Ωcm. A pronounced photocurrent response is observed on excitation with white light (FIG. 4(b)). However, a significant increase in the spectral responsivity is observed between about 400 and 580 nm, coincident with the absorption of the quinquethiophene (FIG. 4(c)). This visible photoresponse occurs with both rapid (<1 s) and slow (>300 s) rise and decay times (FIG. 4b, bottom inset). This slow time response is commonly observed in ZnO photoconductivity and originates from the release and recapture of chemisorbed oxygen molecules on reacting with a hole ($O_2^-$(ads)+h$^+$→$O_2$(g)). Release of chemisorbed oxygen heavily dopes the ZnO surface, which prevents charge-carrier recombination and prolongs the photocarrier lifetime. In the system according to some embodiments of the present invention, selective photoexcitation of the quinquethiophene leads to an increase in photocurrent through multiple processes. Initially, electron transfer occurs rapidly from the dye into the ZnO, consistent with the energy level diagram (FIG. 4©, inset). Then, the remaining hole on the quinquethiophene relaxes through capturing an electron from a surface chemisorbed oxygen, resulting in the slower photoconductive response[38].

Figure 4D:
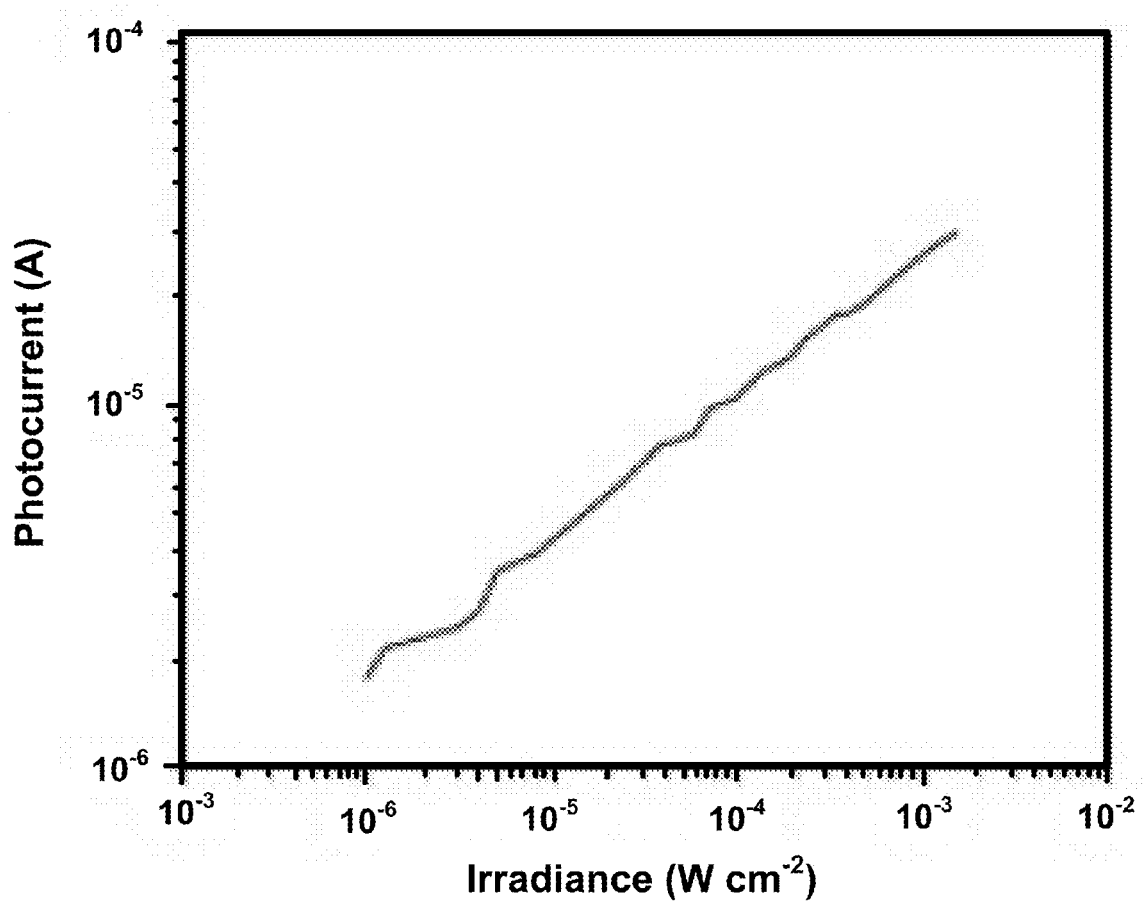
Figure 4E:
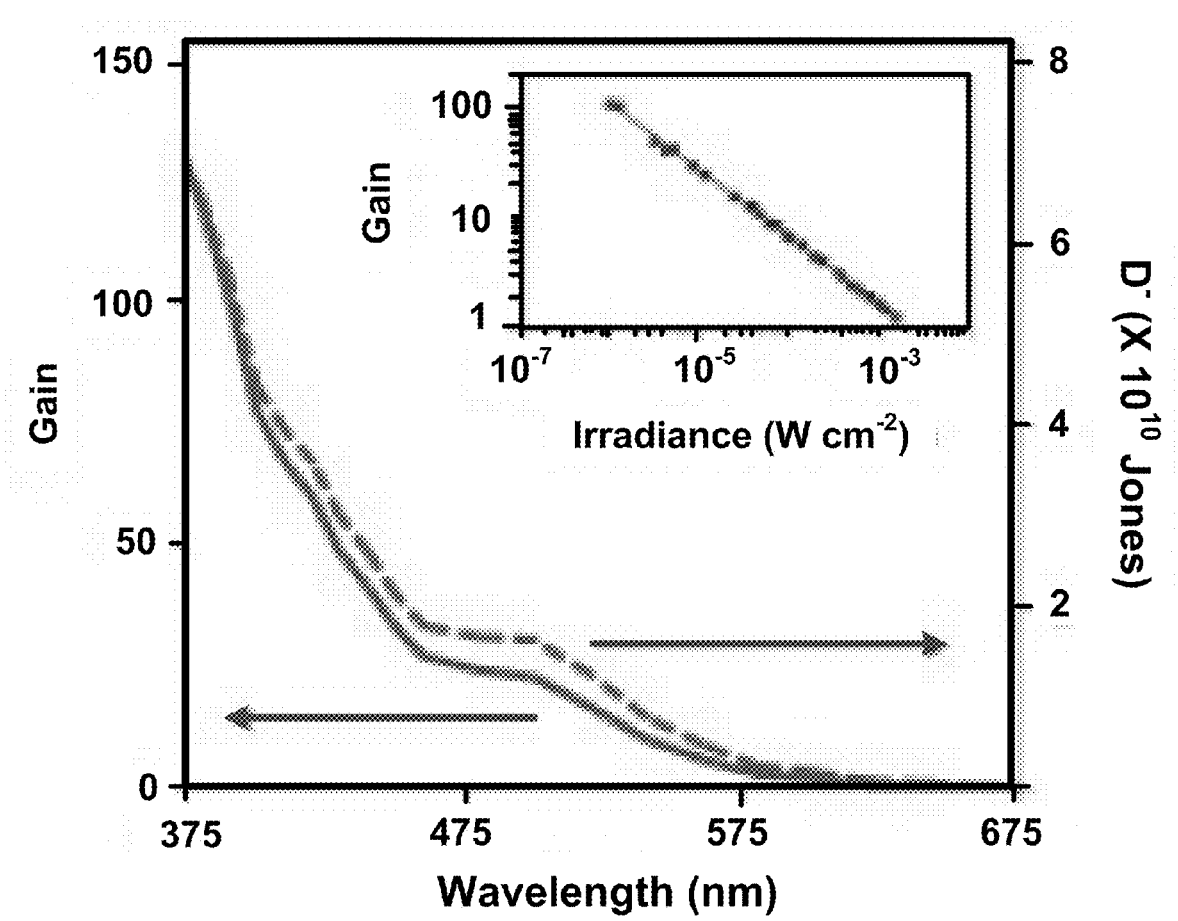

The 500 nm photocurrent response varies over three orders of magnitude of incident intensity, corresponding to a dynamic range greater than 60 dB (as defined in imaging applications; FIG. 4(d)) and comparable to current complementary metal-oxide-semiconductor image sensors. Photoconductive gain is defined as the ratio of the number of photocurrent electrons per time to the number of incident photons per time and derived from the spectral responsivity (FIG. 4(e)). A high gain is required for achieving sensitive detection of an optical signal, which is desirable for low-light measurements. When selectively exciting the organic (λ=500 nm), the photoconductive gain is above unity (100%) and typically ranges from 1.2 to 120 at low electric fields (1.2 V μm$^{-1}$), depending on light intensity (FIG. 4(e), inset). The decrease in gain at higher intensities is due to saturation of the photoexcited trap states[39].

The photodetector sensitivity (or detectivity) refers to the minimum optical signal that can be distinguished above noise. The dark-current density for a typical 5TmDCA/ZnO photoconductor at 2.4 V μm$^{-1}$ is about 17 mA cm$^{-2}$. From these values, the Johnson noise is estimated from (4 kTB/R)$^{1/2}$ to be about 10 pA Hz$^{-1/2}$ and the shot noise (2

Figure 4F:
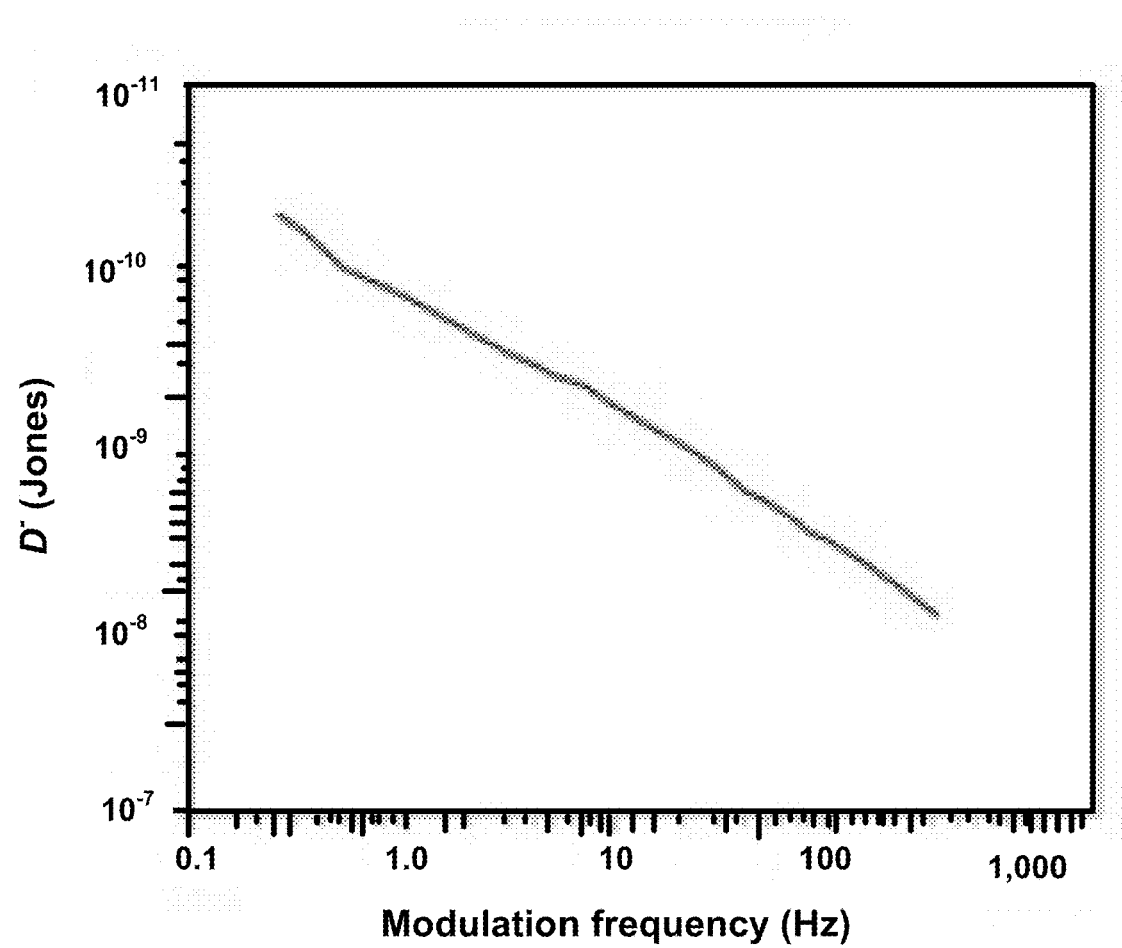

$qI_d/B)^{1/2}$ is about 61 pA Hz$^{-1/2}$, where k is Boltzmann's constant, T is temperature, B is the noise bandwidth, R is the dark resistance of the detector, q is the electron charge and $I_d$ is the dark current. The 2 V bandwidth-normalized noise current $I_n^*$ of these photoconductors was directly measured to be about 130 pA Hz$^{-1/2}$, which is about two times the shot noise limit. The area-normalized detectivity D* in Jones (cm$^2$ Hz$^{1/2}$ W$^{-1}$) is calculated from $D^* = A^{1/2}SR/I_n^*$, where A is the device area and SR is the spectral responsivity (FIG. 4(e)). FIG. 4(f) shows the detectivity response under modulated illumination. At 500 nm excitation, 1 Hz and 2 V bias, D* is observed to be 7.0×10$^9$ Jones. At slower modulation frequencies (0.25 Hz), the 500 nm D* is found to increase to about 2.0×10$^{10}$ Jones with little apparent dropoff. Although it was focused on the performance due to the organic, the D* values increase by a factor of about five when exciting ZnO (370 nm).

It is believed that these room-temperature, low-bias (<2 V), 500 nm excitation gain and detectivity values are the highest measured for organic or hybrid organic/inorganic photoconductors[40, 41, 42] ever, making the present invention a breakthrough. Furthermore, the 30 Hz D* (about 8.2×10$^8$ Jones) is approximately equal to the best reported amorphous silicon photodetectors[43]. Although these values are not as high as the recently reported inorganic PbS nanoparticle photodetectors[4, 5], these initial measurements are quite promising and it is expected that further enhancements with appropriate device engineering would be made, for example by reducing the noise and dark current through changing the device dimensions or contact metal choice. It is further noted that the devices made according to some embodiments of the present invention remained stable after repeated measurement and storage in air for eight months, with virtually no change in dark current or responsivity.

Figure 16:
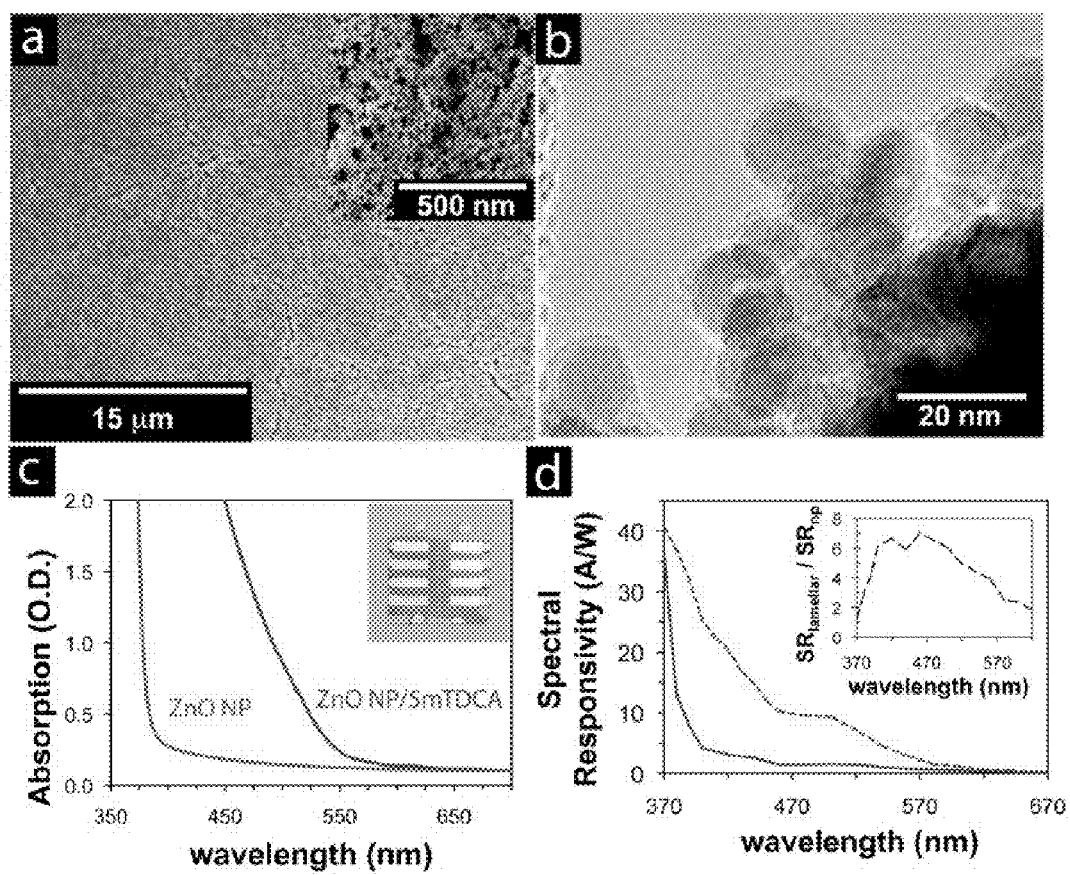
FIG. 16 shows properties of a control ZnO nanoparticle device: (a) Low-magnification and (inset) magnified image of ZnO nanoparticle thin film; (b) TEM image of ZnO nanoparticles removed from the device after sensitization with 5TmDCA; (c) UV/Vis absorption of the ZnO nanoparticle thin film measured before (ZnO NP) and after sensitization with 5TmDCA (ZnO NP/5TmDCA). (inset) Photograph of the control device; and (d) Spectral responsivity of nanoparticle control device (solid) and lamellar hybrid device (dashed) measured under the same conditions (1 V, 8 to 22 µW/cm$^2$). (inset) The ratio of the spectral responsivity of the lamellar (SRlamellar) device divided by the spectral responsivity of the nanoparticle (SRnp) control.

To determine the influence of the lamellar nanostructure on photoconduction, films of 10 nm ZnO nanoparticles were prepared, sintered to guarantee ZnO conduction, and functionalized with 5TmDCA, as shown in FIG. 16. From EDS, about 2.5±0.3 5TmDCA molecules are bound per 100 Zn atoms, corresponding to about 31% surface coverage of the nanoparticles. Although the 5TmDCA:Zn ratio is much lower, about 80% of the 500 nm light is absorbed in one pass, according to the ultraviolet-visible absorption spectra, as shown in FIG. 16(c). At the ZnO bandgap, the spectral responsivity of the lamellar device is only about 10% greater than the control, as shown in FIG. 16(d). However, from 400 to 560 nm, the lamellar devices exhibit spectral responsivities 400-600% greater than the control. This increase cannot be explained by absorption alone; the lamellar architecture must either enhance majority-carrier and/or trap-state lifetimes or reduce majority-carrier transit time. A detailed comparison of the trap-state and carrier lifetimes and mobilities may help elucidate the actual enhancement mechanism.

Thus, in one aspect, the present invention provides a method for making a nanostructure. In one embodiment, the method includes the steps of
a) providing a H$_2$O/dimethylsulphoxide (DMSO) solution of Zn(NO)$_3$.6H$_2$O and surfactant in an undivided cell with a three-electrode configuration for electrochemical synthesis;
b) performing electrochemical synthesis to the solution to allow a nanostructure with Zn(OH)$_2$ films to grow on at least one working electrode at a first temperature T$_1$; and
c) converting the nanostructure with Zn(OH)$_2$ films to a nanostructure with ZnO films at a second temperature T$_2$, wherein the first temperature T$_1$ and the second temperature T$_2$ satisfy the relationship of T$_1$<T$_2$, and wherein as formed the nanostructure with ZnO films is characterized with a hybrid structure where between any two neighboring ZnO films, there is one layer of surfactant in contacting with the two neighboring ZnO films.

In one embodiment, the surfactant comprises strongly interacting amphiphilic molecules having optoelectronic functionality, wherein the strongly interacting amphiphilic molecules are selected from the group consisting of: SDS, Decanoic acid, PyBA, PyCA, 3TCA and 5TmDCA.

In one embodiment, the first temperature T$_1$ is about 80° C., the second temperature T$_2$ is about 150° C.

The method further comprises the step of performing electrochemical synthesis under constant magnetic stirring.

In one embodiment, the three-electrode configuration comprises a Zn counter electrode, a Ag/AgCl reference electrode, and one or more working electrodes. The one or more working electrodes comprise a substrate selected from the group consisting of an ITO substrate, a fluorine tin oxide substrate and a Ag substrate.

In yet another aspect, the present invention provides an article of manufacture. In one embodiment, as shown in FIG. 17, the article of manufacture has
a) a plurality of zinc oxide layers 1702 substantially in parallel, wherein each zinc oxide layer 1702 has a thickness d$_1$; and
b) a plurality of organic molecule layers 1706 substantially in parallel, wherein each organic molecule layer has a thickness d$_2$ and a plurality of molecules with a functional group that is bindable to zinc ions;
wherein for every pair of neighboring zinc oxide layers 1704, one of the plurality of organic molecule layers 1706 is positioned in between the pair of neighboring zinc oxide layers 1704 to allow the functional groups of the plurality of organic molecules to bind to zinc ions in the neighboring zinc oxide layers 1704 to form a lamellar hybrid structure with a geometric periodicity d$_1$+d$_2$, and wherein d$_1$ and d$_2$ satisfy the relationship of d$_1 \leq$ d$_2 \leq$ 3d$_1$.

In one embodiment, each of the zinc oxide layer is a monolayer of ZnO nanoparticles, wherein the thickness d$_1$ of the monolayer of ZnO nanoparticles is in the range of about 1-1.5 nm.

In one embodiment, the plurality of organic molecules comprises strongly interacting amphiphilic molecules having optoelectronic functionality. In one embodiment, the strongly interacting amphiphilic molecules are selected from the group consisting of: SDS, Decanoic acid, PyBA, PyCA, 3TCA and 5TmDCA, wherein the thickness d$_2$ of the layer of organic molecules is in the range of about 1-4.5 nm.

The article of manufacture can be, for example, a photoconductor.

In a further aspect, the present invention provides an article of manufacture. In one embodiment, as shown in FIG. 18, the article of manufacture has:
a) a plurality of zinc oxide layers 1802 substantially in parallel, wherein each zinc oxide layer 1802 has a thickness d$_1$; and
b) a plurality of organic molecule layers 1806 substantially in parallel, wherein each organic molecule layer has a thickness d$_2$ and a plurality of molecules with a functional group that is bindable to zinc ions;
wherein for every pair of neighboring organic molecule layers 1806, one of the plurality of zinc oxide layers 1802 is positioned in between the pair of neighboring organic molecule layers 1804 to allow the functional groups of the plurality of organic molecules in the neighboring zinc oxide layers 1704 to bind to zinc ions in the zinc oxide layer 1802 to form a lamellar hybrid structure with a geometric periodicity $d_2+d_1$, and wherein $d_1$ and $d_2$ satisfy the relationship of $d_1 \leq d_2 \leq 3d_1$.

In one embodiment, each of the zinc oxide layer is a monolayer of ZnO nanoparticles, wherein the thickness $d_1$ of the monolayer of ZnO nanoparticles is in the range of about 1-1.5 nm.

In one embodiment, the plurality of organic molecules comprises strongly interacting amphiphilic molecules having optoelectronic functionality, wherein the strongly interacting amphiphilic molecules are selected from the group consisting of: SDS, Decanoic acid, PyBA, PyCA, 3TCA and 5TmDCA, and wherein the thickness $d_2$ of the layer of organic molecules is in the range of about 1-4.5 nm.

In yet another aspect, the present invention provides an article of manufacture. In one embodiment, as shown in FIG. 17, the article of manufacture has:

a) a plurality of inorganic layers with metal ions 1702 substantially in parallel, wherein each inorganic layer 1702 has a thickness $d_1$; and b) a plurality of organic molecule layers 1706 substantially in parallel, wherein each organic molecule layer has a thickness $d_2$ and a plurality of molecules with a functional group that is bindable to metal ions;

wherein for every pair of neighboring inorganic layers 1704, one of the plurality of organic molecule layers 1706 is positioned in between the pair of neighboring inorganic layers 1704 to allow the functional groups of the plurality of organic molecules to bind to metal ions in the neighboring inorganic layers 1704 to form a lamellar hybrid structure, and wherein $d_1$ and $d_2$ satisfy the relationship of $d_1 \leq d_2 \leq 3d_1$.

In one embodiment, each of the inorganic layers is a monolayer of metallic nanoparticles, wherein the metallic nanoparticles are ZnO nanoparticles, and wherein the thickness $d_1$ of the monolayer of ZnO nanoparticles is in the range of about 1-1.5 nm.

In one embodiment, the plurality of organic molecules comprises strongly interacting amphiphilic molecules having optoelectronic functionality, wherein the strongly interacting amphiphilic molecules are selected from the group consisting of: SDS, Decanoic acid, PyBA, PyCA, 3TCA and 5TmDCA, and wherein the thickness $d_2$ of the layer of organic molecules is in the range of about 1-4.5 nm.

Accordingly, it is concluded that hybrid electronically active materials consisting of nanoscale alternating layers of inorganic and organic components are attained in essentially one step by integrating molecular self-assembly and electrodeposition according to various embodiments of the present invention. The presence of conjugated moieties in the organic not only adds an optoelectronic component to the hybrid, but also synergistically stabilizes the lamellar architecture on thermal conversion of the insulator $Zn(OH)_2$ to the semiconductor ZnO. This biologically non-toxic hybrid combines the spectral tunability of an organic with the superior conductivity and protective encapsulation of an inorganic to attain stable photoconductive performance. The method provided by the present invention, furthermore, offers a promising approach towards the synthesis and device integration of previously inaccessible bifunctional p-type/n-type hybrid materials with lamellar architecture. The strength of the π-π interactions in preserving this lamellar nanostructure suggests the presence of conducting pathways in both the organic and inorganic layers, making this type of structure ideal for other applications including photovoltaics.

EXAMPLES

Aspects of the present teachings may be further understood in light of the following examples, which should not be construed as limiting the scope of the present teachings in any way.

Organic Surfactant Synthesis

The terthiophene carboxylic acid was synthesized according to the literature, replacing the base used, lithium di-isopropylamide, with n-butyl lithium[44]. Synthetic details of 5TmDCA are further set forth infra. The remaining surfactants, PyBA (Aldrich, 97%), decanoic acid (Aldrich, 99%), 1-pyrenecarboxylic acid (Alfa Aesar, 98%) and SDS (J. T. Baker, ultrapure bioreagent), were all available commercially. Extended molecular lengths were calculated using Molecular Mechanics minimization with the MM$^+$ force field in Hyperchem.

Electrochemical Synthesis

Electrochemical syntheses were carried out in 6 ml solutions (1:1 (v/v) DMSO/$H_2O$) of 0.02 M $Zn(NO_3)_3 \cdot 6H_2O$ (Aldrich, 98%) with 1.5-3.0 mg surfactant, purged for 20 min with Ar, in an undivided cell vial using a three-electrode set-up (EG&G Princeton Applied Research potentiostat model 263A) with a Zn counter electrode (Alfa Aesar, 99.9997%) and a Ag/AgCl reference electrode (BAS Inc. model RE-5B). Water is required for reduction of $NO_3^-$ to generate $OH^-$, and DMSO is added for surfactant solubility. Working electrode substrates (indium tin oxide (ITO), fluorine tin oxide or Ag) were placed upright in the cell and deposition was achieved potentiostatically at −0.9 V for 30 min-24 h, depending on growth time, under constant magnetic stirring at 80° C. Deposited films were rinsed with water and ethanol and dried with dry $N_2$. For device measurements, the working electrodes were ultraviolet-ozone-treated 2.0 cm$^2$ glass substrates with pre-patterned ITO (140 nm thick, about 50Ω sheet resistance, Kintek). For all other characterization, 2.5 cm×2 cm ITO-glass (120 nm thick, about 100 ≠ sheet resistance, Applied Thin Films) or fluorine tin oxide/glass (TEC#8/3, about 9Ω sheet resistance, Hartford Glass) electrodes were used.

Synthesis of Powder Standards

ZnO nanoparticles (Nanotek, 99.999%) were used as a standard for FTIR, powder XRD and XAS measurements. Nanoparticles for control measurements were synthesized as reported by Pacholski et al.[45]. The α-$Zn(OH)_2$ standard was synthesized as reported by Ogata et al.[23]. Briefly, a 60 ml 0.17 M aqueous solution of $Zn(NO_3)_2 \cdot 6H_2O$ (Aldrich, 99.9%) was stirred at 5° C. and a 36 ml 0.23 M NaOH solution was prepared. The solutions were stirred together at 5° C. for 1 h (hour) and a cloudy white suspension was obtained. The product was filtered, washed three times with $H_2O$ and air-dried at room temperature for 24 h. X-ray diffraction (XRD) analysis showed a homogeneous single phase of α-$Zn(OH)_2$ nitrate (actual stoichiometry: $Zn_5(OH)_8(NO_3)_2 \cdot 2H_2O$)[30].

Device Fabrication

For conductivity measurements, a 500-nm-2-μm-thick active layer of ZnO templated with either PyBA or 5TmDCA was electrochemically deposited onto a pre-patterned ITO anode (15 ohm/square). The ZnO/5TmDCA was annealed under vacuum at 150° C. for 12 h. A 2-μm-thick photoresist protective layer (poly(methyl) methacrylate, Microchem Corp.) was spin-cast and either dried under vacuum for 4-24 h for the PyBA, or annealed for 10 min on a 150° C. hot plate for the 5TmDCA, to prevent shorting. Substrates were reactive-ion-etch cleaned in 50 s.c.c.m. $O_2$ at 100 W until the tips of the ZnO sheets were observed by SEM. The samples were then reactive-ion-etch cleaned in 50 s.c.c.m. $O_2$ at 50 W for 1 min and loaded into an electron beam evaporator equipped with an in situ temperature sensor for evaporation of a top electrode, 400 nm/150 nm (Ti/Ag or Au), through a shadow mask, resulting in a 2 mm×2 mm active area for each device. The maximum temperature during evaporation was 61° C.

For the control nanoparticle devices, a mixture consisting of 6 wt % ZnO nanoparticles and 3% polyethylene glycol ($M_w$=1,000) in water was ultrasonicated for 2 h to create a slurry. The slurry was doctor-bladed onto pre-patterned ITO electrodes masked with a single layer of scotch tape, and sintered at 400° C. for 30 min. Sensitization occurred by soaking in a 1 mM solution of 5TmDCA in DMSO for three days. To remove residual molecules, substrates were soaked in DMSO for 15 min and rinsed with methanol three times. A 400 nm/150 nm Ti/Ag top electrode was evaporated on top using a shadow mask with a 2 mm×2 mm active area for each device.

The initial thicknesses of deposited films were measured using a Tencor P10 profilometer. After fabrication and testing, device active area thicknesses were measured by cross-sectional SEM, and ranged from 700 nm-1.2 μm for the PyBA samples, 700-800 nm for the 5TmDCA samples and 800 nm-1 μm for the control device.

Further details of the sample characterization, surface atom estimate for ZnO nanoparticles, optical measurements, PyBA photoluminescence quenching control measurement, 5TmDCA energy level determination and device testing are set forth infra.

Sample Characterization

Structure and composition was investigated by SEM (Hitachi S-4800-II cFEG, LEO Gemini 1525 sFEG, and FEI Quanta sFEG), TEM (JEOL JEM-2100F), and XRD (Rigaku ATX-G X-ray diffractometer, 50 kV and 240 mA, Cu K source). The Zn:S EDS ratio was verified by measuring a ZnS standard.

Approximately 5 mg of ZnO and PyBA standards were ground with 0.5-1.0 g of KBr and pressed into a 7 mm diameter pellet for FTIR (Thermo Nicolet, Nexus 870 FTIR spectrometer). Hybrid films were deposited onto a 100 nm Ag film thermally evaporated onto a glass slide. FTIR was collected at 4 $cm^{-1}$ resolution in transmission for the standards and in polarization modulation-infrared reflection-absorption spectroscopy (PM-IRRAS) mode for films at grazing incidence reflection mode using a tabletop optics module (TOM) with the incident angle of the polarization-modulated light set to 80° relative to the surface normal.

TGA (Mettler Toledo TGA/SDTA851) was measured by heating from room temperature to 600° C. at 1° C./min under $N_2$ flow.

XAS measurements around the Zn—K absorption edge were carried out at the 5-BM-D beam line of the DuPont-Northwestern-Dow Collaborative Access Team at the Advanced Photon Source. A double Si(111) crystal monochromator was used to select photon energies with an energy resolution of about one eV at the Zn—K edge. The entrance slit to the monochromator was 1×8 (v×h) $mm^2$ and the entrance slit to the sample was 2×5 $mm^2$. The monochromatic X-ray energy was calibrated with a Zn metal foil in transmission using two Oxford-Danfysik ion chambers. The first chamber monitored the incident beam intensity and the second the transmitted intensity. The spectra of the standards were measured in transmission. The hybrid films were measured in fluorescence mode mounted 45° from a 13-element solid-state Ge detector incident beam, respectively. Raw data was processed using the Athena package and data simulation carried out using FEFF code as known to people skilled in the art.

All annealing steps were performed for 12 h under vacuum. To determine if the presence of residual solvent impacted the resulting lamellar spacing and inorganic morphology, an additional set of unannealed samples was placed under 10 mtorr vacuum at room temperature for 24 h. All SAXS, XAS, SEM, FTIR and TEM data between both room temperature samples remained the same.

Surface Atom Estimate for ZnO Nanoparticles

The estimate for nanoparticle size corresponding to 50% surface Zn atom density was determined from modeling a wurtzite unit cell assuming ZnO lattice parameters of a=3.2495 Å and c=5.207 Å, and with Zn atoms on only one of the (001) basal facet. A nanoparticle composed of 4a×4a×2c ZnO unit cells would have 41 surface Zn atoms, 82 total Zn atoms, a volume of about 1620 $Å^3$, and a spherical diameter of about 1.4 Å.

For determining the sensitization ratio for the ZnO nanoparticle control device, the calculation for the ratio of surface Zn atoms for 10 nm nanoparticles is based from a previous procedure. For the wurtzite crystal structure a density of one Zn atom per 17.6 $Å^2$ surface area was approximated. The total number of atoms for a specific nanoparticle size is determined by the unit cell volume, which has 2 Zn atoms per unit cell. From this estimate, 8.1% of the total Zn atoms are on the surface for 10 nm diameter ZnO nanoparticles. This value assumes that the nanoparticles would have to remain unfused in order to achieve this surface coverage, and therefore the calculations set forth above represent an upper bound for the maximum possible 5TmDCA:Zn ratio.

Optical Measurements

Photoluminescence (Horiba Jobin-Yvon Nanolog-3 fluorimeter) was recorded with samples mounted 60° from the detector to minimize direct scatter of the excitation beam into the detector. Absorbance was measured by a Cary 500 UV/Vis/NIR with a Diffuse Reflectance Accessory.

PyBA Photoluminescence Quenching Control Measurement

Only a 16% quenching of the photoluminescence was observed for control spin cast thin films of PyBA powder on quartz that were annealed at 150° C. for the same length of time. This quenching was attributed to sublimation loss of PyBA based off the following NMR experiment. 10 mg of PyBA powder was placed in a sealed J. Young NMR vial with air atmosphere. The bottom of the NMR vial containing the solid sample was placed in a 150° C. oil bath for 12 h. A significant amount of sublimation of pyrene butyric acid was observed in the NMR vial. Furthermore, the $^1H$ NMR spectra of the annealed PyBA sample was virtually identical to that of an unannealed PyBA control. There were no new impurity peaks in the annealed sample with an NMR intensity >5% of a PyBA $^1H$.

5TmDCA Energy Level Determination

The energy levels were measured via cyclic voltammetry using a three-electrode set-up (EG&G Princeton Applied Research potentiostat model 263A) with a Ag/AgCl reference electrode, a platinum working and counter electrode. A ferrocene/ferrocinium redox couple was used to convert to eV. A film of 5TmDCA was dropcast from DMSO onto the working electrode surface and dried at 90° C. for about 2 h. Cyclic voltammetry was run at 50 mV/s in triplicate using a 0.1 M tetrabutyl ammonium hexafluorophosphate in $CH_3CN$ solution. The HOMO/LUMO levels were estimated from the voltage onset of oxidation and reduction. These values obtained are about 0.2-0.4 eV lower than previously reported values of underivatized thiophenes.

Device Testing

The average resistivity of the ZnO sheets is derived from the equation=R*d*A/t; where R is the measured resistance, d is the cross-sectional area density of sheets that are exposed to the metal contact (estimated via top-down SEM micrographs to be 3%), A is the active area of the device (2 mm×2 mm), and t is the thickness (750 nm). These resistivity values represent an upper bound to the material resistivity upon consideration of the presence of contact resistance.

Two-probe conductivity measurements were collected using a Keithley Source Meter measurement setup. A home-built substrate holder with Au-coated spring pins was used to clamp the substrate and contact the electrodes. For photoconductive measurements, a calibrated 150 W Oriel Xe solar simulator was used as the light source and an Oriel cornerstone 130 monochromator. Appropriate optical filters prevented grating overtones from illuminating the sample. The power density illuminating the sample at each wavelength was measured separately using a calibrated silicon photodiode and varied by placing the appropriate neutral density filters in the beam path.

For spectral responsivity, gain and detectivity data, the sample was placed in an optically sealed faraday cage, and connected in series with the source meter. The conductivity was measured versus time for specific wavelengths with and without illumination for 30 s. The average photocurrent from 12 s to 20 s of illumination compared to the dark background was used to obtain the photocurrent response. The wavelength dependent photocurrent was scaled according to the system calibration to obtain spectral responsivity and photoconductive gain.

The absence of a visible photocurrent response in the ZnO/PyBA photodetectors, which were synthesized and fabricated using virtually identical conditions, indicates that it does not originate from defect trap states in the ZnO itself.

Modulation frequency dependent photoconductivity data at 500 nm excitation was obtained by placing an optical chopper in the beam path for frequencies >3 Hz, and by automatically controlling the monochromator shutter using a labview program for frequencies <3 Hz. A bias voltage was applied across the device using a Signal Recovery 7265 DSP lock-in amplifier. The output signal was connected to a current preamplifier and measured with the lock-in amplifier, reading an RMS voltage. To obtain D*, the RMS spectral response was converted to a peak response by multiplying the signal by 2, which assumes a square wave waveform. An oscilloscope was connected to the output signal, to verify the accuracy of the reading.

Noise measurements were obtained in A/Hz1/2 in an optically-sealed probe station, connected to a current preamplifier and measured with a Signal Recovery 7265 DSP lock-in amplifier. The sample was biased at the same voltage as with the lock-in amplifier. After normalizing the noise reading of the lock-in amplifier with a 1 s time constant, the noise value was measured by integrating the noise at random frequencies between 1.5-20 kHz using a 12 dB/octave filter slope and a 10 msec time constant (corresponding to 17.2 Hz bandwidth). Confirmation of random noise at the measured frequency was verified by visual display of the noise spectrum on the lock-in amplifier.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

REFERENCES

1. Gomez-Romero, P. & Sanchez, C. *Functional Hybrid Materials* (Wiley-VCH, 2004).
2. Mitzi, D. B., Chondroudis, K. & Kagan, C. R. Organic-inorganic electronics. *IBM J. Res. Dev.* 45, 29-45 (2001).
3. Petritz, R. L. Theory of photoconductivity in semiconductor films. *Phys. Rev.* 104, 1508-1516 (1956).
4. Konstantatos, G. et al. Ultrasensitive solution-cast quantum dot photodetectors. *Nature* 442, 180-183 (2006).
5. Konstantatos, G., Clifford, J., Levina, L. & Sargent, E. H. Sensitive solution-processed visible-wavelength photodetectors. *Nature Photon.* 1, 531-534 (2007).
6. Mann, S. & Ozin, G. A. Synthesis of inorganic materials with complex form. *Nature* 382, 313-318 (1996).
7. Yang, P. D. et al. Hierarchically ordered oxides. *Science* 282, 2244-2246 (1998).
8. Stupp, S. I. & Braun, P. V. Molecular manipulation of microstructures: Biomaterials, ceramics, and semiconductors. *Science* 277, 1242-1248 (1997).
9. Braun, P. V., Osenar, P. & Stupp, S. I. Semiconducting superlattices templated by molecular assemblies. *Nature* 380, 325-328 (1996).
10. Huang, X. Y. & Li, J. From single to multiple atomic layers: A unique approach to the systematic tuning of structures and properties of inorganic-organic hybrid nanostructured semiconductors. *J. Am. Chem. Soc.* 129, 3157-3162 (2007).
11. Osenar, P., Braun, P. V. & Stupp, S. I. Lamellar semiconductor-organic nanostructures from self-assembled templates. *Adv. Mater.* 8, 1022-1025 (1996).
12. Coakley, K. M. et al. Infiltrating semiconducting polymers into self-assembled mesoporous titania films for photovoltaic applications. *Adv. Funct. Mater.* 13, 301-306 (2003).
13. Nguyen, T. Q. et al. Control of energy transfer in oriented conjugated polymer-mesoporous silica composites. *Science* 288, 652-656 (2000).
14. Messmore, B. W., Hulvat, J. F., Sone, E. D. & Stupp, S. I. Synthesis, self-assembly, and characterization of supramolecular polymers from electroactive dendron rodcoil molecules. *J. Am. Chem. Soc.* 126, 14452-14458 (2004).
15. Reese, C. & Bao, Z. Organic single-crystal field-effect transistors. *Mater. Today* 10, 20-27 (2007).
16. Schenning, A. P. H. J. & Meijer, E. W. Supramolecular electronics; nanowires from self-assembled pi-conjugated systems. *Chem. Commun.* 3245-3258 (2005).
17. Hulvat, J. F., Sofos, M., Tajima, K. & Stupp, S. I. Self-assembly and luminescence of oligo(p-phenylene vinylene) amphiphiles. *J. Am. Chem. Soc.* 127, 366-372 (2005).
18. Sofos, M. et al. Nanoscale structure of self-assembling hybrid materials of inorganic and electronically active organic phases. *J. Phys. Chem. C* 112, 2881-2887 (2008).
19. Tajima, K., Li, L.-S. & Stupp, S. I. Nanostructured oligo (p-phenylene vinylene)/silicate hybrid films: One-step fabrication and energy transfer studies. *J. Am. Chem. Soc.* 128, 5488-5495 (2006).

20. Choi, K. S., Lichtenegger, H. C., Stucky, G. D. & McFarland, E. W. Electrochemical synthesis of nanostructured ZnO films utilising self-assembly of surfactant molecules at solid-liquid interfaces. *J. Am. Chem. Soc.* 124, 12402-12403 (2002).
21. Jing, H. Y. et al. Electrochemical self-assembly of highly oriented ZnO-surfactant hybrid multilayers. *J. Phys. Chem. B* 109, 2881-2884 (2005).
22. Usui, H., Sasaki, T. & Koshizaki, N. Ultraviolet emission from layered nanocomposites of $Zn(OH)_2$ and sodium dodecyl sulphate prepared by laser ablation in liquid. *Appl. Phys. Lett.* 87, 063105 (2005).
23. Ogata, S., Tagaya, H., Karasu, M. & Kadokawa, J. New preparation method for organic-inorganic layered compounds by organo derivatization reaction of $Zn(OH)_2$ with carboxylic acids. *J. Mater. Chem.* 10, 321-327 (2000).
24. Soci, C. et al. ZnO nanowire UV photodetectors with high internal gain. *Nano Lett.* 7, 1003-1009 (2007).
25. Law, M. et al. Nanowire dye-sensitized solar cells. *Nature Mater.* 4, 455-459 (2005).
26. Mottaghi, M. et al. Low-operating-voltage organic transistors made of bifunctional self-assembled monolayers. *Adv. Funct. Mater.* 17, 597-604 (2007).
27. Quist, P. A. C. et al. Photogeneration and decay of charge carriers in hybrid bulk heterojunctions of ZnO nanoparticles and conjugated polymers. *J. Phys. Chem. B* 110, 10315-10321 (2006).
28. Beek, W. J. E., Wienk, M. M. & Janssen, R. A. J. Hybrid solar cells from regioregular polythiophene and ZnO nanoparticles. *Adv. Funct. Mater.* 16, 1112-1116 (2006).
29. Olson, D. C. et al. Hybrid photovoltaic devices of polymer and ZnO nanofiber composites. *Thin Solid Films* 496, 26-29 (2006).
30. Oswald, H. & Asper, R. in *Preparation and Crystal Growth of Materials with Layered Structures* (ed. Lieth, R. M. A.) 71 (D. Reidel Publishing Company, 1977).
31. Brinker, C. J., Lu, Y. F., Sellinger, A. & Fan, H. Y. Evaporation-induced self-assembly: Nanostructures made easy. *Adv. Mater.* 11, 579-585 (1999).
32. Boeckler, C., Oekermann, T., Feldhoff, A. & Wark, M. Role of the critical micelle concentration in the electrochemical deposition of nanostructured ZnO films under utilization of amphiphilic molecules. *Langmuir* 22, 9427-9430 (2006).
33. Yoshida, T. et al. Self-assembly of zinc oxide thin films modified with tetrasulfonated metallophthalocyanines by one-step electrodeposition. *Chem. Mater.* 11, 2657-2667 (1999).
34. Blom, F. R., Van de Pol, F. C. M., Bauhuis, A. & Popma, Th. J. A. R. F. Planar magnetron sputtered ZnO films II: Electrical properties. *Thin Solid Films* 204, 365-376 (1991).
35. Gijzeman, O. L. J., Langelaar, J. & Van Voorst, J. D. W. Triplet excimer emission from pyrene single crystals. *Chem. Phys. Lett.* 5, 269-272 (1970).
36. Loutfy, R. O., Hsiao, C. K., Ong, B. S. & Keoshkerian, B. Electrochemical evaluation of electron acceptor materials. *Can. J. Chem.* 62, 1877-1885 (1984).
37. Müllen, K. & Wegner, G. *Electronic Materials: The Oligomer Approach* (Weinham, 1998).
38. Broich, B. & Heiland, G. Charge transfer between zinc oxide crystals and dye layers. *Surf. Sci.* 92, 247-264 (1980).
39. Munoz, E. et al. Photoconductor gain mechanisms in GaN ultraviolet detectors. *Appl. Phys. Lett.* 71, 870-872 (1997).
40. Porter, V. J. et al. Photoconduction in annealed and chemically treated CdSe/ZnS inorganic nanocrystal films. *J. Phys. Chem. C* 112, 2308-2316 (2008).
41. Daubler, T. K. et al. Photogeneration and transport of charge carriers in hybrid materials of conjugated polymers and dye-sensitized $TiO_2$. *J. Appl. Phys.* 86, 6915-6923 (1999).
42. Yamamoto, Y. et al. Photoconductive coaxial nanotubes of molecularly connected electron donor and acceptor layers. *Science* 314, 1761-1764 (2006).
43. Dong, L., Yue, R. & Liu, L. Fabrication and characterization of integrated uncooled infrared sensor arrays using a-Si thin-film transistors as active elements. *J. Microelectromech.* 14, 1167-1177 (2005).
44. Kagan, J., Arora, S. K. & Ustunol, A. 2,2'-5',2"-terthiophene-5-carboxylic acid and 2,2'-5',2"-terthiophene-5, 5"-dicarboxylic acid. *J. Org. Chem.* 48, 4076-4078 (1983).
45. Pacholski, C., Kornowski, A. & Weller, H. Self-assembly of ZnO: From nanodots, to nanorods. *Angew. Chem. Int. Ed.* 41, 1188-1191 (2002).

What is claimed is:

1. An article of manufacture comprising:
   a) a plurality of inorganic layers with metal ions substantially in parallel, wherein each inorganic layer has a thickness $d_1$; and
   b) a plurality of organic molecule layers substantially in parallel, wherein each organic molecule layer has a thickness $d_2$ and a plurality of molecules with a functional group that is bindable to metal ions;
      wherein for every pair of neighboring inorganic layers, one of the plurality of organic molecule layers is positioned in between the pair of neighboring inorganic layers to allow the functional groups of the plurality of organic molecules to bind to metal ions in the neighboring inorganic layers to form a lamellar hybrid structure with a geometric periodicity $d_2+d_1$ in a range between about 2 nm and about 6 nm, and wherein $d_1$ and $d_2$ satisfy the relationship of $d_1 < d_2 < 3d_1$.

2. The article of manufacture of claim 1, wherein each of the inorganic layers is a monolayer of metallic nanoparticles.

3. The article of manufacture of claim 2, wherein the metallic nanoparticles are ZnO nanoparticles.

4. The article of manufacture of claim 3, wherein the thickness $d_1$ of the monolayer of ZnO nanoparticles is in the range of about 1-1.5 nm.

5. The article of manufacture of claim 1, wherein the plurality of organic molecules comprises strongly interacting amphiphilic molecules having optoelectronic functionality.

6. The article of manufacture of claim 5, wherein the strongly interacting amphiphilic molecules are selected from the group consisting of: SDS, Decanoic acid, PyBA, PyCA, 3TCA and 5TmDCA.

7. The article of manufacture of claim 6, wherein the thickness $d_2$ of the layer of organic molecules is in the range of about 1-4.5 nm.

8. The article of manufacture of claim 1 is a photoconductor.

9. An article of manufacture made by a method, wherein the method comprising:
   a) providing a $H_2O$/dimethylsulphoxide (DMSO) solution of $Zn(NO)_3 6H_2O$ and surfactant in an undivided cell with a three-electrode configuration for electrochemical synthesis;
   b) performing electrochemical synthesis to the solution to allow a nanostructure with $Zn(OH)_2$ films to grow on at least one working electrode at a first temperature $T_1$; and c) converting the nanostructure with $Zn(OH)_2$ films to a nanostructure with ZnO films at a second temperature $T_2$, wherein the first temperature $T_1$ and the second temperature $T_2$ satisfy the relationship of $T_1<T_2$, and wherein as formed the nanostructure with ZnO films is characterized with a hybrid structure where between any two neighboring ZnO films, there is one layer of surfactant in contacting with the two neighboring ZnO films, and wherein each ZnO film has a thickness $d_1$, and the one layer of surfactant has a thickness $d_2$, and the hybrid structure has a geometric periodicity $d_2+d_1$ in a range between about 2 nm and about 6 nm.

10. An article of manufacture comprising:
a) a plurality of zinc oxide layers substantially in parallel, wherein each zinc oxide layer has a thickness $d_1$; and
b) a plurality of organic molecule layers substantially in parallel, wherein each organic molecule layer has a thickness $d_2$ and a plurality of molecules with a functional group that is bindable to zinc ions;

wherein for every pair of neighboring zinc oxide layers, one of the plurality of organic molecule layers is positioned in between the pair of neighboring zinc oxide layers to allow the functional groups of the plurality of organic molecules to bind to zinc ions in the neighboring zinc oxide layers to form a lamellar hybrid structure with a geometric periodicity $d_1+d_2$ in a range between about 2 nm and about 6 nm, and wherein $d_1$ and $d_2$ satisfy the relationship of $d_1<d_2<3d_1$.

11. The article of manufacture of claim 10, wherein each of the zinc oxide layer is a monolayer of ZnO nanoparticles.

12. The article of manufacture of claim 11, wherein the thickness $d_1$ of the monolayer of ZnO nanoparticles is in the range of about 1-1.5 nm.

13. The article of manufacture of claim 10, wherein the plurality of organic molecules comprises strongly interacting amphiphilic molecules having optoelectronic functionality.

14. The article of manufacture of claim 13, wherein the strongly interacting amphiphilic molecules are selected from the group consisting of: SDS, Decanoic acid, PyBA, PyCA, 3TCA and 5TmDCA.

15. The article of manufacture of claim 14, wherein the thickness $d_2$ of the layer of organic molecules is in the range of about 1-4.5 nm.

16. The article of manufacture of claim 10 is a photoconductor.

17. An article of manufacture comprising:
a) a plurality of zinc oxide layers substantially in parallel, wherein each zinc oxide layer has a thickness $d_1$; and
b) a plurality of organic molecule layers substantially in parallel, wherein each organic molecule layer has a thickness $d_2$ and a plurality of molecules with a functional group that is bindable to zinc ions;

wherein for every pair of neighboring organic molecule layers, one of the plurality of zinc oxide layers is positioned in between the pair of neighboring organic molecule layers to allow the functional groups of the plurality of organic molecules in the neighboring zinc oxide layers to bind to zinc ions in the zinc oxide layer to form a lamellar hybrid structure with a geometric periodicity $d_2+d_1$ in a range between about 2 nm and about 6 nm, and wherein $d_1$ and $d_2$ satisfy the relationship of $d_1<d_2<3d_1$.

18. The article of manufacture of claim 17, wherein each of the zinc oxide layer is a monolayer of ZnO nanoparticles.

19. The article of manufacture of claim 18, wherein the thickness $d_1$ of the monolayer of ZnO nanoparticles is in the range of about 1-1.5 nm.

20. The article of manufacture of claim 17, wherein the plurality of organic molecules comprises strongly interacting amphiphilic molecules having optoelectronic functionality.

21. The article of manufacture of claim 20, wherein the strongly interacting amphiphilic molecules are selected from the group consisting of: SDS, Decanoic acid, PyBA, PyCA, 3TCA and 5TmDCA.

22. The article of manufacture of claim 21, wherein the thickness $d2$ of the layer of organic molecules is in the range of about 1-4.5 nm.

23. The article of manufacture of claim 17 is a photoconductor.

* * * * *